US012146089B2

(12) United States Patent
Ippen et al.

(10) Patent No.: US 12,146,089 B2
(45) Date of Patent: *Nov. 19, 2024

(54) NANOSTRUCTURE INK COMPOSITIONS FOR INKJET PRINTING

(71) Applicant: Shoei Chemical Inc., Tokyo (JP)

(72) Inventors: Christian Ippen, Cupertino, CA (US); Donald Zehnder, San Carlos, CA (US); Ruiqing Ma, Morristown, NJ (US)

(73) Assignee: SHOEI CHEMICAL INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/084,272

(22) Filed: Dec. 19, 2022

(65) Prior Publication Data

US 2023/0235225 A1 Jul. 27, 2023

Related U.S. Application Data

(63) Continuation of application No. 17/016,642, filed on Sep. 10, 2020, now Pat. No. 11,555,149.

(60) Provisional application No. 62/898,776, filed on Sep. 11, 2019.

(51) Int. Cl.
| | |
|---|---|
| C09K 11/88 | (2006.01) |
| B82Y 20/00 | (2011.01) |
| B82Y 30/00 | (2011.01) |
| B82Y 40/00 | (2011.01) |
| C08G 65/26 | (2006.01) |
| C09D 5/22 | (2006.01) |
| C09D 11/36 | (2014.01) |
| C09D 11/38 | (2014.01) |
| C09K 11/02 | (2006.01) |
| C09K 11/70 | (2006.01) |
| H10K 30/35 | (2023.01) |
| H10K 50/115 | (2023.01) |
| H10K 71/60 | (2023.01) |

(52) U.S. Cl.
CPC ........ *C09K 11/883* (2013.01); *C08G 65/2609* (2013.01); *C09D 5/22* (2013.01); *C09D 11/36* (2013.01); *C09D 11/38* (2013.01); *C09K 11/02* (2013.01); *C09K 11/025* (2013.01); *C09K 11/70* (2013.01); *H10K 30/35* (2023.02); *H10K 71/611* (2023.02); *B82Y 20/00* (2013.01); *B82Y 30/00* (2013.01); *B82Y 40/00* (2013.01); *H10K 50/115* (2023.02)

(58) Field of Classification Search
CPC ..... C09K 11/883; C09K 11/02; C09K 11/025; H10K 50/115
See application file for complete search history.

(56) References Cited

U.S. PATENT DOCUMENTS

| | | |
|---|---|---|
| 5,505,928 A | 4/1996 | Alivisatos et al. |
| 6,207,229 B1 | 3/2001 | Bawendi et al. |
| 6,225,198 B1 | 5/2001 | Alivisatos et al. |
| 6,306,736 B1 | 10/2001 | Alivisatos et al. |
| 6,322,901 B1 | 11/2001 | Bawendi et al. |
| 6,576,291 B2 | 6/2003 | Bawendi et al. |
| 6,607,829 B1 | 8/2003 | Bawendi et al. |
| 6,788,453 B2 | 9/2004 | Banin et al. |
| 6,821,337 B2 | 11/2004 | Bawendi et al. |
| 6,861,155 B2 | 3/2005 | Bawendi et al. |
| 7,060,243 B2 | 6/2006 | Bawendi et al. |
| 7,125,605 B2 | 10/2006 | Bawendi et al. |
| 7,138,098 B2 | 11/2006 | Bawendi et al. |
| 7,374,824 B2 | 5/2008 | Bawendi et al. |
| 7,557,028 B1 | 7/2009 | Scher et al. |
| 7,566,476 B2 | 7/2009 | Bawendi et al. |
| 7,572,395 B2 | 8/2009 | Whiteford et al. |
| 7,645,397 B2 | 1/2010 | Parce et al. |
| 8,062,967 B1 | 11/2011 | Scher et al. |
| 8,101,234 B2 | 1/2012 | Bawendi et al. |
| 8,143,703 B2 | 3/2012 | Heald et al. |
| 8,158,193 B2 | 4/2012 | Bawendi et al. |
| 8,282,412 B1 | 10/2012 | Yaguchi et al. |
| 8,425,803 B2 | 4/2013 | Parce et al. |
| 8,563,133 B2 | 10/2013 | Whiteford et al. |
| 8,916,064 B2 | 12/2014 | Liu et al. |
| 9,005,480 B2 | 4/2015 | Furuta et al. |
| 9,139,770 B2 | 9/2015 | Freeman et al. |
| 9,169,435 B2 | 10/2015 | Guo et al. |
| 10,790,411 B2 | 9/2020 | Manders et al. |

(Continued)

OTHER PUBLICATIONS

Wells, R. et al., "The use of tris(trimethylsilyl)arsine to prepare gallium arsenide and indium arsenide," Chemistry of Materials Technical Report No. DU/DC/TR-10, Oct. 3, 1988, 13 pages.
Guzelian, A. et al., "Colloidal chemical synthesis and characterization of InAs nanocrystal quantum dots," Applied Physics Letters, vol. 69, No. 10, Sep. 2, 1996, 3 pages, pp. 1432-1434.
Xie, R. et al., "Colloidal InP nanocrystals as efficient emitters covering blue to near-infrared," Journal of the American Chemical Society, vol. 129, No. 50, Nov. 23, 2007, 2 pages, pp. 15432-15433.
Micic, O. et al., "Core-shell quantum dots of lattice-matched ZnCdSe2 shells on InP cores: Experiment and theory," The Journal of Physical Chemistry B, vol. 104, No. 51, Dec. 28, 2000, 8 pages, pp. 12149-12156.

(Continued)

*Primary Examiner* — C Melissa Koslow
(74) *Attorney, Agent, or Firm* — Alleman Hall & Tuttle LLP

(57) ABSTRACT

The invention pertains to the field of nanotechnology. The disclosure provides nanostructure compositions comprising (a) at least one organic solvent; (b) at least one population of nanostructures comprising a core and at least one shell, wherein the nanostructures comprise inorganic ligands bound to the surface of the nanostructures; and (c) at least one poly(alkylene oxide) additive. The nanostructure compositions comprising at least one poly(alkylene oxide) additive show improved solubility in organic solvents. And, the nanostructure compositions show increased suitability for use in inkjet printing. The disclosure also provides methods of producing emissive layers using the nanostructure compositions.

19 Claims, 1 Drawing Sheet

(56) References Cited

U.S. PATENT DOCUMENTS

| | | | |
|---|---|---|---|
| 11,555,149 B2* | 1/2023 | Ippen | .............. C09D 11/38 |
| 11,753,587 B2 | 9/2023 | Ippen et al. | |
| 2008/0118755 A1 | 5/2008 | Whiteford et al. | |
| 2011/0262752 A1 | 10/2011 | Bawendi et al. | |
| 2011/0263062 A1 | 10/2011 | Bawendi et al. | |
| 2015/0236195 A1 | 8/2015 | Guo et al. | |

OTHER PUBLICATIONS

Liu, Z. et al., "Coreduction colloidal synthesis of III-V nanocrystals: The case of InP," Angewandte Chemie International Edition, vol. 47, No. 19, Apr. 21, 2008, 3 pages, pp. 3540-3542.

Li, L. et al., "Economic synthesis of high quality InP nanocrystals using calcium phosphide as the phosphorus precursor," Chemistry of Materials, vol. 20, No. 8, Mar. 20, 2008, 3 pages, pp. 2621-2623.

Battaglia, D. et al., "Formation of high quality InP and InAs nanocrystals in a noncoordinating solvent," Nano Letters, vol. 2, No. 9, Aug. 15, 2002, 4 pages, pp. 1027-1030.

Nann, T. et al., "Water splitting by visible light: A nanophotocathode for hydrogen production," Angewandte Chemie International Edition, vol. 49, No. 9, Feb. 22, 2010, 4 pages, pp. 1574-1577.

Borchert, H. et al., "Investigation of ZnS passivated InP nanocrystals by XPS," Nano Letters vol. 2, No. 2, Dec. 14, 2001, 4 pages, pp. 151-154.

Li, L. et al., "One-pot synthesis of highly luminescent InP/ZnS nanocrystals without precursor injection," Journal of the American Chemical Society, vol. 130, No. 35, Aug. 8, 2008, 2 pages, pp. 11588-11589.

Hussain, S. et al., "One-pot fabrication of high-quality InP/ZnS (core/shell) quantum dots and their application to cellular imaging," ChemPhysChem, vol. 10, No. 9-10, Jun. 9, 2009, 5 pages, pp. 1466-1470.

Xu, S. et al., "Rapid synthesis of high-quality InP nanocrystals," Journal of the American Chemical Society, vol. 128, No. 4, Jan. 6, 2007, 2 pages, pp. 1054-1055.

Micic, O. et al., "Size-dependent spectroscopy of InP quantum dots," The Journal of Physical Chemistry B, vol. 101, No. 25, Jun. 19, 1997, 9 pages, pp. 4904-4912.

Haubold, S. et al., "Strongly luminescent InP/ZnS core-shell nanoparticles," ChemPhysChem, vol. 2, No. 5, May 15, 2001, 4 pages, pp. 331-334.

Cros-Gagneux, A. et al., "Surface chemistry of InP quantum dots: A comprehensive study," Journal of the American Chemical Society, vol. 132, No. 51, Dec. 2, 2010, 11 pages, pp. 18147-18157.

Micic, O. et al., "Synthesis and characterization of InP, GaP, and GaInP2 quantum dots," The Journal of Physical Chemistry, vol. 99, No. 19, May 1, 1995, 6 pages, pp. 7754-7759.

Guzelian, A. et al., "Synthesis of size-selected, surface-passivated InP nanocrystals," The Journal of Physical Chemistry, vol. 100, No. 17, Apr. 25, 1996, 8 pages, pp. 7212-7219.

Lucey, D. et al., "Monodispersed InP quantum dots prepared by colloidal chemistry in a non-coordinating solvent," Chemistry of Materials, vol. 17, No. 14, Jun. 15, 2005, 9 pages, pp. 3754-3762.

Lim, J. et al., "InP@ZnSeS, core@composition gradient shell quantum dots with enhanced stability," Chemistry of Materials, vol. 23, No. 20, Oct. 25, 2011, 6 pages, Supporting Information.

Zan, F. et al., "Experimental studies on blinking behavior of single InP/ZnS quantum dots: Effects of synthetic conditions and UV irradiation," The Journal of Physical Chemistry C, vol. 116, No. 6, Jan. 19, 2012, 7 pages, pp. 3944-3950.

Kim, S., et al., "Highly Luminescent InP/GaP/ZnS Nanocrystals and Their Application to White Light-Emitting Diodes," Journal of the American Chemical Society, vol. 134, No. 8, Feb. 3, 2012, 6 pages, pp. 3804-3809.

* cited by examiner

2 TBAF + ZnF$_2$ → TBA$_2$ZnF$_4$ in NMF at room temperature

↓

QD-OA + TBA$_2$ZnF$_4$ → QD-ZnF$_4^-$TBA$^+$ + TBAOA in toluene/NMF at 70C

↓

Wash exchanged QDs with toluene

↓

QD-ZnF$_4^-$TBA$^+$ + DDA$^+$Cl$^-$ → QD-ZnF$_4^-$DDA$^+$ + TBACl

↓

Precipitate with acetonitrile

↓

Redisperse QD-ZnF$_4^-$DDA$^+$ in toluene for device fabrication

NANOSTRUCTURE INK COMPOSITIONS FOR INKJET PRINTING

RELATED APPLICATIONS

This application is a continuation of U.S. patent Ser. No. 11/555,149B2 filed Sep. 10, 2020, which claims benefit of U.S. Provisional Application No. 62/898,776, filed Sep. 11, 2019, the entire contents of which are incorporated by reference.

BACKGROUND OF THE INVENTION

Field of the Invention

The invention pertains to the field of nanotechnology. The disclosure provides nanostructure compositions comprising (a) at least one organic solvent; (b) at least one population of nanostructures comprising a core and at least one shell, wherein the nanostructures comprise inorganic ligands bound to the surface of the nanostructures; and (c) at least one poly(alkylene oxide) additive. The nanostructure compositions comprising at least one poly(alkylene oxide) additive show improved solubility in organic solvents. And, the nanostructure compositions show increased suitability for use in inkjet printing. The disclosure also provides methods of producing emissive layers using the nanostructure compositions.

Background Art

Semiconductor nanostructures can be incorporated into a variety of electronic and optical devices. The electrical and optical properties of such nanostructures vary, e.g., depending on their composition, shape, and size. For example, size-tunable properties of semiconductor nanostructures are of great interest for applications such as electroluminescent devices, lasers, and biomedical labeling. Highly luminescent nanostructures are particularly desirable for electroluminescent device applications.

Methods for the inkjet printing of nanostructures to make electronic devices are known. See, for example, U.S. Patent Appl. Publication Nos. 2019/0062581, 2019/0039294, 2018/0230321, and 2002/0156156 and U.S. Pat. No. 8,765,014.

U.S. Patent Appl. Publication No. 2018/0230321 discloses inks of CdZnS/ZnS quantum dots (blue), CdZnSeS/ZnS quantum dots (green), and CdSe/CdS/ZnS quantum dots (red) containing oleate and trioctylphosphine ligands. The inks were obtained by adding the quantum dots to a substituted aromatic or heteroaromatic solvent such as 1-methoxynaphthalene, cyclohexylbenzene, 3-isopropylbiphenyl, benzyl benzoate, 1-tetralone, or 3-phenoxytoluene at a concentration of 5 weight % and mixing and heating until the quantum dots were fully dispersed.

WO2017/079255 discloses semiconductor nanocrystals with halometallate ligands, wherein the halometallate ligand has the formula $MX_{3-}$, $MX_{4-}$ or $MX_4^{2-}$, and wherein M is a metal from Group 12 or Group 13 of the periodic table and X is halide. Particular halometallate ligands include $CdCl_3^-$, $CdCl_4^{2-}$, $CdI_3^-$, $CdBr_3^-$, $CdBr_4^{2-}$, $InCl_4^-$, $HgCl_3^-$, $ZnCl_3^-$, $ZnCl_4^{2-}$, and $ZnBr_4^{2-}$. The semiconductor nanocrystals with halometallate ligands were made by forming a solution of the corresponding organic ligand-capped semiconductor nanocrystals and the halometallate anions and maintaining the solution under conditions that allowed the halometallate anions to undergo ligand exchange with the organic ligands.

BRIEF SUMMARY OF THE INVENTION

The present disclosure provides a nanostructure composition comprising:
(a) at least one organic solvent;
(b) at least one nanostructure comprising a core and at least one shell, wherein the nanostructure comprises inorganic ligands bound to the surface of the nanostructure; and
(c) at least one poly(alkylene oxide) additive.

In some embodiments, the core in the nanostructure composition comprises at least one of Si, Ge, Sn, Se, Te, B, C, P, BN, BP, BAs, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $Al_2OC$, or combinations thereof.

In some embodiments, the core in the nanostructure composition comprises InP.

In some embodiments, the at least one shell in the nanostructure composition comprises CdS, CdSe, CdO, CdTe, ZnS, ZnO, ZnSe, ZnTe, MgTe, GaAs, GaSb, GaN, HgO, HgS, HgSe, HgTe, InAs, InSb, InN, AlAs, AN, AlSb, AlS, PbS, PbO, PbSe, PbTe, MgO, MgS, MgSe, MgTe, CuCl, Ge, Si, or alloys thereof.

In some embodiments, the at least one shell in the nanostructure composition comprises a first shell comprising ZnSe and a second shell comprising ZnS.

In some embodiments, the inorganic ligand in the nanostructure composition comprises a halometallate anion.

In some embodiments, the halometallate anion in the nanostructure composition is fluorozincate, tetrafluoroborate, or hexafluorophosphate.

In some embodiments, the halometallate anion in the nanostructure composition has the structure of one of Formulas (I)-(III):

$$MX_3^- \quad (I);$$

$$MX_{4-x}Y_x^- \quad (II); \text{ or}$$

$$MX_{4-x}Y_x^{2-} \quad (III);$$

wherein:
M is selected from the group consisting of Zn, Cd, Hg, Cu, Ag, and Au;
X is selected from the group consisting of Br, Cl, F, and I;
Y is selected from the group consisting of Br, Cl, F, and I; and
x is 0, 1, or 2.

In some embodiments, the halometallate anion in the nanostructure composition is $CdCl_3^-$, $CdCl_4^{2-}$, $CdI_3^-$, $CdBr_3^-$, $CdBr_4^{2-}$, $InCl_4^-$, $HgCl_3^-$, $ZnCl_3^-$, $ZnCl_4^{2-}$, or $ZnBr_4^{2-}$.

In some embodiments, the inorganic ligand in the nanostructure composition comprises an organic cation is selected from the group consisting of a tetraalkylammonium cation, an alkylphosphonium cation, a formamidinium cation, a guanidinium cation, an imidazolium cation, and a pyridinium cation.

In some embodiments, the inorganic ligand in the nanostructure composition comprises a tetraalkylammonium cation.

In some embodiments, the inorganic ligand in the nanostructure composition comprises oleyltrimethylammonium, phenylethyltrimethylammonium, benzyltrimethylammonium, phenyltrimethylammonium, benzylhexadecyldimethylammonium, benzyltetradecyldimethylammonium, benzyldodecyldimethylammonium, benzyldecyldimethylammonium, benzyloctyldimethylammonium, benzyltributylammonium, benzyltriethylammonium, a tetraalkylammonium cation selected from the group consisting of dioctadecyldimethylammonium, dihexadecyldimethylammonium, ditetradecyldimethylammonium, didodecyldimethylammonium, didecyldimethylammonium, dioctyldimethylammonium, bis(ethylhexyl)dimethylammonium, octadecyltrimethylammonium, hexadecyltrimethylammonium, tetradecyltrimethylammonium, dodecyltrimethylammonium, decyltrimethylammonium, octyltrimethylammonium, tetrabutylammonium, tetrapropylammonium, diisopropyldimethylammonium, tetraethylammonium, and tetramethylammonium.

In some embodiments, the organic ligand in the nanostructure composition comprises a $ZnF_4^-$ anion and a didecyldimethylammonium cation.

In some embodiments, the organic ligand in the nanostructure composition comprises an alkylphosphonium cation.

In some embodiments, the alkyphosphonium cation in the nanostructure composition is selected from the group consisting of tetraphenylphosphonium, dimethyldiphenylphosphonium, methyltriphenoxyphosphonium, hexadecyltributylphosphonium, octyltributylphosphonium, tetradecyltrihexylphosphonium, tetrakis(hydroxymethyl)phosphonium, tetraoctylphosphonium, tetrabutylphosphonium, and tetramethylphosphonium.

In some embodiments, the weight percentage of nanostructures in the nanostructure composition is between about 0.5% and about 10%.

In some embodiments, the organic solvent in the nanostructure composition has a boiling point at 1 atmosphere of about 250° C. to about 350° C.

In some embodiments, the organic solvent in the nanostructure composition has a viscosity of about 1 mPa·s to about 15 mPa·s.

In some embodiments, the organic solvent in the nanostructure composition has a surface tension of about 20 dyne/cm to about 50 dyne/cm.

In some embodiments, the organic solvent in the nanostructure composition is an alkylnaphthalene, an alkoxynaphthalene, an alkylbenzene, an aryl, an alkyl-substituted benzene, a cycloalkylbenzene, a $C_9$-$C_{20}$ alkane, a diarylether, an alkyl benzoate, an aryl benzoate, or an alkoxy-substituted benzene.

In some embodiments, the organic solvent in the nanostructure composition is selected from the group consisting of 1-tetralone, 3-phenoxytoluene, acetophenone, 1-methoxynaphthalene, n-octylbenzene, n-nonylbenzene, 4-methylanisole, n-decylbenzene, p-diisopropylbenzene, pentylbenzene, tetralin, cyclohexylbenzene, chloronaphthalene, 1,4-dimethylnaphthalene, 3-isopropylbiphenyl, p-methylcumene, dipentylbenzene, o-diethylbenzene, m-diethylbenzene, p-diethylbenzene, 1,2,3,4-tetramethylbenzene, 1,2,3,5-tetramethylbenzene, 1,2,4,5-tetrametylbenzene, butylbenzene, dodecylbenzene, 1-methylnaphthalene, 1,2,4-trichlorobenzene, diphenyl ether, diphenylmethane, 4-isopropylbiphenyl, benzyl benzoate, 1,2-bi(3,4-dimethylphenyl)ethane, 2-isopropylnaphthalene, dibenzyl ether, and combinations thereof.

In some embodiments, the organic solvent in the nanostructure composition is 1-methylnaphthalene, n-octylbenzene, 1-methoxynapththalene, 3-phenoxytoluene, cyclohexylbenzene, 4-methylanisole, n-decylbenzene, or a combination thereof.

In some embodiments, the weight percentage of the organic solvent in the nanostructure composition is between about 70% and about 99%.

In some embodiments, the at least one poly(alkylene oxide) in the nanostructure composition has Formula (IV):

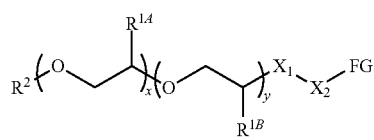

(IV)

wherein:
x is 1 to 100;
y is 0 to 100;
$R^{1A}$ and $R^{1B}$ independently are H or $C_{1-20}$ alkyl;
$R^2$ is $C_{1-20}$ alkyl;
$X_1$ is a bond or $C_{1-12}$ alkyl;
$X_2$ is a bond, —O—, —OC(=O)—, or amido;
FG is —OH, —NH$_2$, —NH$_4^+$, —N$_3$, —C(=O)OR$^3$, —P(=O)(OR$^4$)$_3$, or —P(R$^5$)$_4$;
$R^3$ is H, $C_{1-20}$ alkyl, or $C_{6-14}$ aryl;
$R^4$ is independently H, $C_{1-20}$ alkyl, or $C_{6-14}$ aryl; and
$R^5$ is independently H, $C_{1-20}$ alkyl, or $C_{6-14}$ aryl.

In some embodiments, x is 2-20 and y is 1-10 in the at least one poly(alkylene oxide) having Formula (IV) in the nanostructure composition.

In some embodiments, $R^{1A}$ is H and $R^{1B}$ is $CH_3$ in the at least one poly(alkylene oxide) having Formula (IV) in the nanostructure composition.

In some embodiments, $X_1$ is a bond and $X_2$ is a bond in the at least one poly(alkylene oxide) having Formula (IV) in the nanostructure composition.

In some embodiments, FG is —OH, —NH$_2$, —N$_3$, or —CO$_2$H in the at least one poly(alkylene oxide) having Formula (IV) in the nanostructure composition.

In some embodiments, the at least one poly(alkylene oxide) in the nanostructure composition has Formula VI:

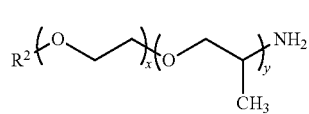

(VI)

wherein:
x is 1 to 100;
y is 0 to 100; and
$R^2$ is $C_{1-20}$ alkyl.

In some embodiments, x is 19, y is 3, and $R_2$ is —CH$_3$ in the at least one poly(alkylene oxide) having Formula (VI) in the nanostructure composition.

In some embodiments, the weight percentage of the poly(alkylene oxide) additive in the nanostructure composition is between about 0.05% and about 2%.

In some embodiments, the nanostructure composition further comprises a surface-active compound, a lubricating agent, a wetting agent, a dispersing agent, a hydrophobing agent, an adhesive agent, a flow improver, a defoaming agent, a deaerator, a diluent, a stabilizer, an antioxidant, a viscosity modifier, an inhibitor, or a combination thereof.

The present disclosure also provides a process comprising depositing the nanostructure composition described herein to form a layer on a substrate.

In some embodiments, the nanostructure composition is deposited by inkjet printing.

In some embodiments, the process of depositing the nanostructure composition comprises at least partial removal of the organic solvent.

In some embodiments, the process of depositing the nanostructure composition comprises at least partial removal of the organic solvent by vacuum drying.

In some embodiments, the process of depositing the nanostructure composition comprises at least partial removal of the organic solvent by application of heat.

In some embodiments, the substrate is a first conductive layer.

In some embodiments, the process of depositing the nanostructure composition further comprises depositing a second conductive layer on the nanostructure composition.

In some embodiments, the process of depositing the nanostructure composition further comprises depositing a first transport layer on the first conductive layer, the first transport layer being configured to facilitate the transport of holes from the first conductive layer to the layer comprising the nanostructure composition; and depositing a second transport layer on the layer comprising the nanostructure composition, the second transport layer configured to facilitate the transport of electrons from the second conductive layer to the layer comprising the nanostructure composition.

In some embodiments, the nanostructure composition is deposited in a pattern.

The present disclosure also provides a light emitting diode comprising:
  (a) a first conductive layer;
  (b) a second conductive layer; and
  (c) an emitting layer between the first conductive layer and the second conductive layer, wherein the emitting layer comprises at least one population of nanostructures, wherein the nanostructures comprise (i) at least one organic solvent; (ii) at least one nanostructure comprising a core and at least one shell, wherein the nanostructure comprises inorganic ligands bound to the surface of the nanostructure; and (iii) at least one poly(alkylene oxide) additive.

BRIEF DESCRIPTION OF THE DRAWING

FIG. 1 is a flow chart showing the ligand exchange procedure of Example 2. In the first step, t-butylammonium fluoride (TBAF) and zinc difluoride ($ZnF_2$) were admixed in N-methylformamide (NMF) at room temperature to produce the dianionic halozincate $TBA_2ZnF_4$. In the second step, the dianionic halozincate $TBA_2ZnF_4$ and oleate-capped quantum dots (QD-OA) were admixed in a mixture of toluene and NMF at 70° C. to produce $TBA\text{-}ZnF_4$-capped quantum dots. In the third step, the $TBA\text{-}ZnF_4$-capped quantum dots were washed with toluene. In a fourth step, $TBA\text{-}ZnF_4$-capped quantum dots were admixed with didecyldimethylammonium chloride (DDA-Cl) to produce $DDA\text{-}ZnF_4$-capped quantum dots. In a fifth step, the $DDA\text{-}ZnF_4$-capped quantum dots were precipitated with acetonitrile. In a sixth step, the $DDA\text{-}ZnF_4$-capped quantum dots were redispersed in toluene in preparation for use in a device.

DETAILED DESCRIPTION OF THE INVENTION

Definitions

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in the practice for testing of the present invention, the preferred materials and methods are described herein. Accordingly, the terminology used herein is for the purpose of describing particular embodiments only, and is not intended to be limiting.

As used in this specification and the appended claims, the singular forms "a," "an," and "the" include plural referents unless the context clearly dictates otherwise. Thus, for example, reference to "a nanostructure" includes a plurality of such nanostructures, and the like.

The term "about" as used herein indicates the value of a given quantity varies by +/−10% of the value. For example, "about 100 nm" encompasses a range of sizes from 90 nm to 110 nm, inclusive.

A "nanostructure" is a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, quantum dots, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

A "nanocrystal" is a nanostructure that is substantially monocrystalline. A nanocrystal thus has at least one region or characteristic dimension with a dimension of less than about 500 nm. In some embodiments, the nanocrystal has a dimension of less than about 200 nm, less than about 100 nm, less than about 50 nm, less than about 20 nm, or less than about 10 nm. The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of a nanocrystal heterostructure comprising a core and one or more shells, the core of the nanocrystal is typically substantially monocrystalline, but the shell(s) need not be. In some embodiments, each of the three dimensions of the nanocrystal has a dimension of less than about 500 nm, less than about 200 nm, less than about 100 nm, less than about 50 nm, less than about 20 nm, or less than about 10 nm.

The term "quantum dot" (or "dot") refers to a nanocrystal that exhibits quantum confinement or exciton confinement. Quantum dots can be substantially homogeneous in material properties, or in certain embodiments, can be heterogeneous, e.g., including a core and at least one shell. The optical properties of quantum dots can be influenced by their particle size, chemical composition, and/or surface composition, and can be determined by suitable optical testing available in the art. The ability to tailor the nanocrystal size, e.g., in the range between about 1 nm and about 15 nm, enables photoemission coverage in the entire optical spectrum to offer great versatility in color rendering.

As used herein, the term "monolayer" is a measurement unit of shell thickness derived from the bulk crystal structure of the shell material as the closest distance between relevant lattice planes. By way of example, for cubic lattice structures the thickness of one monolayer is determined as the distance between adjacent lattice planes in the [111] direction. By way of example, one monolayer of cubic ZnSe corresponds to 0.328 nm and one monolayer of cubic ZnS corresponds to 0.31 nm thickness. The thickness of a monolayer of alloyed materials can be determined from the alloy composition through Vegard's law.

As used herein, the term "shell" refers to material deposited onto the core or onto previously deposited shells of the same or different composition and that result from a single act of deposition of the shell material. The exact shell thickness depends on the material as well as the precursor input and conversion and can be reported in nanometers or monolayers. As used herein, "target shell thickness" refers to the intended shell thickness used for calculation of the required precursor amount. As used herein, "actual shell thickness" refers to the actually deposited amount of shell material after the synthesis and can be measured by methods known in the art. By way of example, actual shell thickness can be measured by comparing particle diameters determined from transmission electron microscopy (TEM) images of nanocrystals before and after a shell synthesis.

As used herein, the term "layer" refers to material deposited onto the core or onto previously deposited layers and that result from a single act of deposition of the core or shell material. The exact thickness of a layer is dependent on the material. For example, a ZnSe layer may have a thickness of about 0.328 nm and a ZnS layer may have a thickness of about 0.31 nm.

A "ligand" is a molecule capable of interacting (whether weakly or strongly) with one or more faces of a nanostructure, e.g., through covalent, ionic, van der Waals, or other molecular interactions with the surface of the nanostructure.

"Photoluminescence quantum yield" is the ratio of photons emitted to photons absorbed, e.g., by a nanostructure or population of nanostructures. As known in the art, quantum yield is typically determined by a comparative method using well-characterized standard samples with known quantum yield values.

"Peak emission wavelength" (PWL) is the wavelength where the radiometric emission spectrum of the light source reaches its maximum.

As used herein, the term "full width at half-maximum" (FWHM) is a measure of the size distribution of quantum dots. The emission spectra of quantum dots generally have the shape of a Gaussian curve. The width of the Gaussian curve is defined as the FWHM and gives an idea of the size distribution of the particles. A smaller FWHM corresponds to a narrower quantum dot nanocrystal size distribution. FWHM is also dependent upon the emission wavelength maximum.

As used herein, the term "external quantum efficiency" (EQE) is a ratio of the number of photons emitted from a light emitting diode to the number of electrons passing through the device. The EQE measures how efficiently a light emitting diode converts electrons to photons and allows them to escape. EQE can be measured using the formula:

EQE=[injection efficiency]×[solid-state quantum yield]×[extraction efficiency]

where:
injection efficiency=the proportion of electrons passing through the device that are injected into the active region;
solid-state quantum yield=the proportion of all electron-hole recombinations in the active region that are radiative and thus, produce photons; and
extraction efficiency=the proportion of photons generated in the active region that escape from the device.

As used herein, the term "stable" refers to a mixture or composition that resists change or decomposition due to internal reaction or due to the action of air, heat, light, pressure, other natural conditions, voltage, current, luminance, or other operation conditions. The colloidal stability of a nanostructure composition can be determined by measuring the peak absorption wavelength after admixing at least one population of nanostructures with at least one solvent. The peak absorption wavelength can be measured by irradiating a nanostructure composition with UV or blue (450 nm) light and measuring the output with a spectrometer. The absorption spectrum is compared to the absorption from the original nanostructure composition. A colloid nanostructure composition is stable if the peak absorption wavelength does not shift by more than 5 nm.

"Alkyl" as used herein refers to a straight or branched, saturated, aliphatic radical having the number of carbon atoms indicated. In some embodiments, the alkyl is $C_{1-2}$ alkyl, $C_{1-3}$ alkyl, $C_{1-4}$ alkyl, $C_{1-5}$ alkyl, $C_{1-6}$ alkyl, $C_{1-7}$ alkyl, $C_{1-8}$ alkyl, $C_{1-9}$ alkyl, $C_{1-10}$ alkyl, $C_{1-12}$ alkyl, $C_{1-14}$ alkyl, $C_{1-16}$ alkyl, $C_{1-18}$ alkyl, $C_{1-20}$ alkyl, $C_{8-20}$ alkyl, $C_{12-20}$ alkyl, $C_{14-20}$ alkyl, $C_{16-20}$ alkyl, or $C_{18-20}$ alkyl. For example, $C_{1-6}$ alkyl includes, but is not limited to, methyl, ethyl, propyl, isopropyl, butyl, isobutyl, sec-butyl, tert-butyl, pentyl, isopentyl, and hexyl. In some embodiments, the alkyl is octyl, nonyl, decyl, undecyl, dodecyl, tridecyl, tetradecyl, pentadecyl, hexadecyl, heptadecyl, octadecyl, nonadecyl, or icosanyl.

The term "alkylene," as used herein, alone or in combination, refers to a saturated aliphatic group derived from a straight or branched chain saturated hydrocarbon attached at two or more positions, such as methylene (—$CH_2$—). Unless otherwise specified, the term "alkyl" may include "alkylene" groups.

"Amido" as used herein, refers to both "aminocarbonyl" and "carbonylamino." These terms when used alone or in connection with another group refers to an amido group such as $N(R^L R^M)$—C(O)— or $R^M C(O)$—$N(R^L)$— when used terminally and —C(O)—$N(R^L)$— or —$N(R^M)$—C(O)— when used internally, wherein each of $R^L$ and $R^M$ is independently hydrogen, alkyl, cycloaliphatic, (cycloaliphatic) aliphatic, aryl, araliphatic, heterocycloaliphatic, (heterocycloaliphatic)aliphatic, heteroaryl, carboxy, sulfanyl, sulfinyl, sulfonyl, (aliphatic)carbonyl, (cycloaliphatic)carbonyl, ((cycloaliphatic)aliphatic)carbonyl, arylcarbonyl, (araliphatic) carbonyl, (heterocycloaliphatic)carbonyl, ((heterocycloaliphatic)aliphatic)carbonyl, (heteroaryl)carbonyl, or (heteroaraliphatic)carbonyl, each of which being defined herein and being optionally substituted. Examples of amino groups include alkylamino, dialkylamino, or arylamino. Examples of amido groups include alkylamido (such as alkylcarbonylamino or alkylcarbonylamino), (heterocycloaliphatic)amido, (heteroaralkyl)amido, (heteroaryl)amido, (heterocycloalkyl)alkylamido, arylamido, aralkylamido, (cycloalkyl)alkylamido, or cycloalkylamido.

"Aryl" or "aromatic" as used herein refers to unsubstituted monocyclic or bicyclic aromatic ring systems having from six to fourteen carbon atoms, i.e., a $C_{6-14}$ aryl. Non-limiting exemplary aryl groups include phenyl, naphthyl, phenanthryl, anthracyl, indenyl, azulenyl, biphenyl, biphenylenyl, fluorenyl groups, terphenyl, pyrenyl, 9,9-dimethyl-2-fluorenyl, anthryl, triphenylenyl, chrysenyl, fluorenylidenephenyl, and 5H-dibenzo[a,d]cycloheptenylidenephenyl. In one embodiment, the aryl group is a phenyl, naphthyl, or 9,9-dimethyl-2-fluorenyl.

The terms "halogen" and "halide" as used herein refers to a fluorine, chlorine, bromine or iodine atom.

Unless clearly indicated otherwise, ranges listed herein are inclusive.

A variety of additional terms are defined or otherwise characterized herein.

Inkjet Printing

The formation of thin films using dispersions of nanostructures in organic solvents is often achieved by coating techniques such as spin coating. However, these coating techniques are generally not suitable for the formation of thin films over a large area and do not provide a means to pattern the deposited layer and thus, are of limited use. Inkjet printing allows for precisely patterned placement of thin films on a large scale at low cost. Inkjet printing also allows for precise patterning of nanostructure layers, allows printing pixels of a display, and eliminates the need for photo-patterning. Thus, inkjet printing is very attractive for industrial application—particularly in display applications.

Inkjet printing is a promising technology for generating patterned structures of functional materials such as the pixel array in quantum dot electroluminescent (QDEL) and quantum dot color conversion (QDCC) displays. Inkjet printing is more cost-effective than other printing technology, such as photolithography, due to its requiring fewer process steps and its almost complete utilization of material. Quantum dots are often marketed as printable because they are soluble in organic solvents. However, suitable inks for inkjet printing are required to meet several requirements and the actual printing of a quantum dot ink is not a trivial process.

Inkjet printing of a QDEL display requires the following:
(1) printer head compatibility with respect to swelling and corrosion;
(2) a high boiling point solvent (>240° C.) to prevent ink drying and nozzle clogging;
(3) suitable viscosity (1-12 mPa·s) and surface tension (28-44 dyne/cm) of the ink to provide jettability (e.g., drop formation and nozzle wetting); and
(4) high quantum dot solubility and preservation of emissive properties.

Thus, the compatibility of quantum dots to more polar solvents comprising ester or ether groups needs to be improved, which would then enable the formulation of an ink with suitable viscosity and surface tension.

Nanostructure Composition

In some embodiments, the present disclosure provides a nanostructure composition comprising:
(a) at least one organic solvent;
(b) at least one nanostructure comprising a core and at least one shell, wherein the nanostructure comprises inorganic ligands bound to the surface of the nanostructure; and
(c) at least one poly(alkylene oxide) additive.

In some embodiments, the present disclosure provides a nanostructure composition comprising:
(a) at least one organic solvent;
(b) at least one nanostructure comprising a core and at least one shell, wherein the nanostructure comprises inorganic ligands bound to the surface of the nanostructure, wherein the inorganic ligands comprise a halometallate anion and an organic cation; and
(c) at least one poly(alkylene oxide) additive.

In some embodiments, the nanostructure composition is a nanostructure ink composition.

Nanostructures

In some embodiments, the nanostructure comprises a core and at least one shell. In some embodiments, the nanostructure comprises a core and 1, 2, 3, 4, 5, 6, 7, 8, 9, or 10 shells. In some embodiments, the nanostructure comprises a core and one shell. In some embodiments, the nanostructure comprises a core and two shells. In some embodiments, the nanostructure comprises a core and three shells. In some embodiments, the nanostructure comprises at least two shells wherein the two shells are different.

In some embodiments, the nanostructure comprises organic (first) ligands. In some embodiments, the nanostructure comprises inorganic (second) ligands. In some embodiments, the nanostructure comprises a mixture of organic (first) ligands and inorganic (second) ligands.

In some embodiments, the nanostructure comprises an InP core and a ZnSe shell. In some embodiments, the nanostructure is InP/ZnS. In some embodiments, the nanostructure is a red-emitting InP/ZnS. In some embodiments, the nanostructure is a green-emitting InP/ZnS.

In some embodiments, the nanostructure comprises an InP core, a ZnSe shell, and a ZnS shell. In some embodiments, the nanostructure is InP/ZnSe/ZnS. In some embodiments, the nanostructure is a red-emitting InP/ZnSe/ZnS. In some embodiments, the nanostructure is a green-emitting InP/ZnSe/ZnS.

In some embodiments, the nanostructure comprises a ZnSe core and a ZnS shell. In some embodiments, the nanostructure is ZnSe/ZnS. In some embodiments, the nanostructure is a blue-emitting ZnSe/ZnS.

In some embodiments, the nanostructure comprises a ZnSeTe core, a ZnSe shell, and a ZnS shell. In some embodiments, the nanostructure is ZnSeTe/ZnSe/ZnS. In some embodiments, the nanostructure is a blue-emitting ZnSeTe/ZnSe/ZnS.

The number of monolayers will determine the size of the core/shell(s) nanostructures. The size of the core/shell(s) nanostructures can be determined using techniques known to those of skill in the art. In some embodiments, the size of the core/shell(s) nanostructures is determined using TEM. In some embodiments, the core/shell(s) nanostructures have an average diameter of between about 1 nm and about 15 nm, about 1 nm and about 10 nm, about 1 nm and about 9 nm, about 1 nm and about 8 nm, about 1 nm and about 7 nm, about 1 nm and about 6 nm, about 1 nm and about 5 nm, about 5 nm and about 15 nm, about 5 nm and about 10 nm, about 5 nm and about 9 nm, about 5 nm and about 8 nm, about 5 nm and about 7 nm, about 5 nm and about 6 nm, about 6 nm and about 15 nm, about 6 nm and about 10 nm, about 6 nm and about 9 nm, about 6 nm and about 8 nm, about 6 nm and about 7 nm, about 7 nm and about 15 nm, about 7 nm and about 10 nm, about 7 nm and about 9 nm, about 7 nm and about 8 nm, about 8 nm and about 15 nm, about 8 nm and about 10 nm, about 8 nm and about 9 nm, about 9 nm and about 15 nm, about 9 nm and about 10 nm, or about 10 nm and about 15 nm. In some embodiments, the core/shell(s) nanostructures have an average diameter of between about 6 nm and about 7 nm.

In some embodiments, the weight percentage of nanostructures in the nanostructure composition is between about 0.5% and about 10%. In some embodiments, the weight percentage of nanostructures in the nanostructure composition is between about 0.5% and about 10%, about 0.5% and about 5%, about 0.5% and about 3%, about 0.5% and about 2%, about 0.5% and about 1.5%, about 0.5% and about 1%, about 1% and about 10%, about 1% and about 5%, about 1% and about 3%, about 1% and about 2%, about 1% and about 1.5%, about 1.5% and about 10%, about 1.5% and about 5%, about 1.5% and about 3%, about 1.5% and about 2%, about 2% and about 10%, about 2% and about 5%, about 2% and about 3%, about 3% and about 10%, about 3% and about 5%, or about 5% and about 10%. In some embodiments, the weight percentage of nanostructures in the nanostructure composition is between about 1.5% and about 3%.

Nanostructure Cores

In some embodiments, the core comprises Si, Ge, Sn, Se, Te, B, C, P, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $Al_2OC$, or combinations thereof.

In some embodiments, the core is a Group III-V nanostructure. In some embodiments, the core is a Group III-V nanocrystal selected from the group consisting of BN, BP, BAs, BSb, AlN, AlP, AlAs, AlSb, GaN, GaP, GaAs, GaSb, InN, InP, InAs, and InSb. In some embodiments, the core is an InP nanocrystal.

The synthesis of Group III-V nanostructures has been described in U.S. Pat. Nos. 5,505,928, 6,306,736, 6,576,291, 6,788,453, 6,821,337, 7,138,098, 7,557,028, 8,062,967, 7,645,397, and 8,282,412 and in U.S. Patent Appl. Publication No. 2015/236195. Synthesis of Group III-V nanostructures has also been described in Wells, R. L., et al., "The use of tris(trimethylsilyl)arsine to prepare gallium arsenide and indium arsenide," *Chem. Mater.* 1:4-6 (1989) and in Guzelian, A. A., et al., "Colloidal chemical synthesis and characterization of InAs nanocrystal quantum dots," *Appl. Phys. Lett.* 69: 1432-1434 (1996).

Synthesis of InP-based nanostructures has been described, e.g., in Xie, R., et al., "Colloidal InP nanocrystals as efficient emitters covering blue to near-infrared," *J. Am. Chem. Soc.* 129:15432-15433 (2007); Micic, O. I., et al., "Core-shell quantum dots of lattice-matched $ZnCdSe_2$ shells on InP cores: Experiment and theory," *J. Phys. Chem. B* 104:12149-12156 (2000); Liu, Z., et al., "Coreduction colloidal synthesis of III-V nanocrystals: The case of InP," *Angew. Chem. Int. Ed. Engl.* 47:3540-3542 (2008); Li, L. et al., "Economic synthesis of high quality InP nanocrystals using calcium phosphide as the phosphorus precursor," *Chem. Mater.* 20:2621-2623 (2008); D. Battaglia and X. Peng, "Formation of high quality InP and InAs nanocrystals in a noncoordinating solvent," *Nano Letters* 2:1027-1030 (2002); Kim, S., et al., "Highly luminescent InP/GaP/ZnS nanocrystals and their application to white light-emitting diodes," *J. Am. Chem. Soc.* 134:3804-3809 (2012); Nann, T., et al., "Water splitting by visible light: A nanophotocathode for hydrogen production," *Angew. Chem. Int. Ed.* 49:1574-1577 (2010); Borchert, H., et al., "Investigation of ZnS passivated InP nanocrystals by XPS," *Nano Letters* 2:151-154 (2002); L. Li and P. Reiss, "One-pot synthesis of highly luminescent InP/ZnS nanocrystals without precursor injection," *J. Am. Chem. Soc.* 130:11588-11589 (2008); Hussain, S., et al. "One-pot fabrication of high-quality InP/ZnS (core/shell) quantum dots and their application to cellular imaging," *Chemphyschem.* 10:1466-1470 (2009); Xu, S., et al., "Rapid synthesis of high-quality InP nanocrystals," *J. Am. Chem. Soc.* 128:1054-1055 (2006); Micic, O. I., et al., "Size-dependent spectroscopy of InP quantum dots," *J. Phys. Chem. B* 101:4904-4912 (1997); Haubold, S., et al., "Strongly luminescent InP/ZnS core-shell nanoparticles," *Chemphyschem.* 5:331-334 (2001); CrosGagneux, A., et al., "Surface chemistry of InP quantum dots: A comprehensive study," *J. Am. Chem. Soc.* 132:18147-18157 (2010); Micic, O. I., et al., "Synthesis and characterization of InP, GaP, and GaInP$_2$ quantum dots," *J. Phys. Chem.* 99:7754-7759 (1995); Guzelian, A. A., et al., "Synthesis of size-selected, surface-passivated InP nanocrystals," *J. Phys. Chem.* 100:7212-7219 (1996); Lucey, D. W., et al., "Monodispersed InP quantum dots prepared by colloidal chemistry in a non-coordinating solvent," *Chem. Mater.* 17:3754-3762 (2005); Lim, J., et al., "InP@ZnSeS, core@composition gradient shell quantum dots with enhanced stability," *Chem. Mater.* 23:4459-4463 (2011); and Zan, F., et al., "Experimental studies on blinking behavior of single InP/ZnS quantum dots: Effects of synthetic conditions and UV irradiation," *J. Phys. Chem. C* 116:394-3950 (2012). However, such efforts have had only limited success in producing InP nanostructures with high quantum yields.

In some embodiments, the core is doped. In some embodiments, the dopant of the nanocrystal core comprises a metal, including one or more transition metals. In some embodiments, the dopant is a transition metal selected from the group consisting of Ti, Zr, Hf, V, Nb, Ta, Cr, Mo, W, Mn, Tc, Re, Fe, Ru, Os, Co, Rh, Ir, Ni, Pd, Pt, Cu, Ag, Au, and combinations thereof. In some embodiments, the dopant comprises a non-metal. In some embodiments, the dopant is ZnS, ZnSe, ZnTe, CdSe, CdS, CdTe, HgS, HgSe, HgTe, CuInS$_2$, CuInSe$_2$, AlN, AlP, AlAs, GaN, GaP, or GaAs.

In some embodiments, the core is a Group II-VI nanocrystal selected from the group consisting of ZnO, ZnSe, ZnS, ZnTe, CdO, CdSe, CdS, CdTe, HgO, HgSe, HgS, and HgTe. In some embodiments, the core is a nanocrystal selected from the group consisting of ZnSe, ZnS, CdSe, and CdS. The synthesis of Group II-VI nanostructures has been described in U.S. Pat. Nos. 6,225,198, 6,322,901, 6,207,229, 6,607,829, 7,060,243, 7,374,824, 6,861,155, 7,125,605, 7,566,476, 8,158,193, and 8,101,234 and in U.S. Patent Appl. Publication Nos. 2011/0262752 and 2011/0263062.

In some embodiments, the core is purified before deposition of a shell. In some embodiments, the core is filtered to remove precipitate from the core solution.

In some embodiments, the core is subjected to an acid etching step before deposition of a shell.

In some embodiments, the diameter of the core is determined using quantum confinement. Quantum confinement in zero-dimensional nanocrystallites, such as quantum dots, arises from the spatial confinement of electrons within the crystallite boundary. Quantum confinement can be observed once the diameter of the material is of the same magnitude as the de Broglie wavelength of the wave function. The electronic and optical properties of nanoparticles deviate substantially from those of bulk materials. A particle behaves as if it were free when the confining dimension is large compared to the wavelength of the particle. During this state, the band gap remains at its original energy due to a continuous energy state. However, as the confining dimension decreases and reaches a certain limit, typically in nanoscale, the energy spectrum becomes discrete. As a result, the band gap becomes size-dependent. Size can be determined as is known in the art, for example, using transmission electron microscopy and/or physical modeling.

In some embodiments, the diameter of the core nanostructure is between about 1 nm and about 9 nm, about 1 nm and about 8 nm, about 1 nm and about 7 nm, about 1 nm and about 6 nm, about 1 nm and about 5 nm, about 1 nm and about 4 nm, about 1 nm and about 3 nm, about 1 nm and about 2 nm, about 2 nm and about 9 nm, about 2 nm and about 8 nm, about 2 nm and about 7 nm, about 2 nm and about 6 nm, about 2 nm and about 5 nm, about 2 nm and about 4 nm, about 2 nm and about 3 nm, about 3 nm and about 9 nm, about 3 nm and about 8 nm, about 3 nm and about 7 nm, about 3 nm and about 6 nm, about 3 nm and about 5 nm, about 3 nm and about 4 nm, about 4 nm and about 9 nm, about 4 nm and about 8 nm, about 4 nm and about 7 nm, about 4 nm and about 6 nm, about 4 nm and about 5 nm, about 5 nm and about 9 nm, about 5 nm and about 8 nm, about 5 nm and about 7 nm, about 5 nm and about 6 nm, about 6 nm and about 9 nm, about 6 nm and about 8 nm, about 6 nm and about 7 nm, about 7 nm and about 9 nm, about 7 nm and about 8 nm, or about 8 nm and about 9 nm. In some embodiments, the diameter of the core nanostructures is about 7 nm.

Nanostructure Shell Layers

In some embodiments, the nanostructures of the present disclosure comprise a core and at least one shell. In some embodiments, the nanostructures comprise a core and at least two shells. In some embodiments, the nanostructure comprises a core and two shells.

The shell can, e.g., increase the quantum yield and/or stability of the nanostructures. In some embodiments, the core and the shell comprise different materials. In some embodiments, the nanostructure comprises shells of different shell material.

In some embodiments, a shell that comprises a mixture of Group II and VI elements is deposited onto a core or a core/shell(s) structure. In some embodiments, the shell is deposited by a mixture of at least two of a zinc source, a selenium source, a sulfur source, a tellurium source, and a cadmium source. In some embodiments, the shell is deposited by a mixture of two of a zinc source, a selenium source, a sulfur source, a tellurium source, and a cadmium source. In some embodiments, the shell is deposited by a mixture of three of a zinc source, a selenium source, a sulfur source, a tellurium source, and a cadmium source. In some embodiments, the shell is composed of zinc and sulfur; zinc and selenium; zinc, sulfur, and selenium; zinc and tellurium; zinc, tellurium, and sulfur; zinc, tellurium, and selenium; zinc, cadmium, and sulfur; zinc, cadmium, and selenium; cadmium and sulfur; cadmium and selenium; cadmium, selenium, and sulfur; cadmium, zinc, and sulfur; cadmium, zinc, and selenium; or cadmium, zinc, sulfur, and selenium.

In some embodiments, the at least one shell comprises CdS, CdSe, CdO, CdTe, ZnS, ZnO, ZnSe, ZnTe, MgTe, GaAs, GaSb, GaN, HgO, HgS, HgSe, HgTe, InAs, InSb, InN, AlAs, AlN, AlSb, AlS, PbS, PbO, PbSe, PbTe, MgO, MgS, MgSe, MgTe, CuCl, Ge, Si, or alloys thereof. In some embodiments, the at least one shell comprises ZnSe. In some embodiments, the at least one shell comprises ZnS. In some embodiments, the at least one shell comprises a first shell comprising ZnSe and a second shell comprising ZnS.

In some embodiments, a shell comprises more than one monolayer of shell material. The number of monolayers is an average for all the nanostructures; therefore, the number of monolayers in a shell can be a fraction. In some embodiments, the number of monolayers in a shell is between 0.25 and 10, 0.25 and 8, 0.25 and 7, 0.25 and 6, 0.25 and 5, 0.25 and 4, 0.25 and 3, 0.25 and 2, 2 and 10, 2 and 8, 2 and 7, 2 and 6, 2 and 5, 2 and 4, 2 and 3, 3 and 10, 3 and 8, 3 and 7, 3 and 6, 3 and 5, 3 and 4, 4 and 10, 4 and 8, 4 and 7, 4 and 6, 4 and 5, 5 and 10, 5 and 8, 5 and 7, 5 and 6, 6 and 10, 6 and 8, 6 and 7, 7 and 10, 7 and 8, or 8 and 10. In some embodiments, the shell comprises between 3 and 5 monolayers.

The thickness of each shell can be determined using techniques known to those of skill in the art. In some embodiments, the thickness of each shell is determined by comparing the average diameter of the nanostructure before and after the addition of each shell. In some embodiments, the average diameter of the nanostructure before and after the addition of each shell is determined by TEM.

In some embodiments, each shell has a thickness of between about 0.05 nm and about 3.5 nm, about 0.05 nm and about 2 nm, about 0.05 nm and about 0.9 nm, about 0.05 nm and about 0.7 nm, about 0.05 nm and about 0.5 nm, about 0.05 nm and about 0.3 nm, about 0.05 nm and about 0.1 nm, about 0.1 nm and about 3.5 nm, about 0.1 nm and about 2 nm, about 0.1 nm and about 0.9 nm, about 0.1 nm and about 0.7 nm, about 0.1 nm and about 0.5 nm, about 0.1 nm and about 0.3 nm, about 0.3 nm and about 3.5 nm, about 0.3 nm and about 2 nm, about 0.3 nm and about 0.9 nm, about 0.3 nm and about 0.7 nm, about 0.3 nm and about 0.5 nm, about 0.5 nm and about 3.5 nm, about 0.5 nm and about 2 nm, about 0.5 nm and about 0.9 nm, about 0.5 nm and about 0.7 nm, about 0.7 nm and about 3.5 nm, about 0.7 nm and about 2 nm, about 0.7 nm and about 0.9 nm, about 0.9 nm and about 3.5 nm, about 0.9 nm and about 2 nm, or about 2 nm and about 3.5 nm.

Ligand Exchange

U.S. Patent Appl. Publication No. 2018/0230321 discloses inks of CdZnS/ZnS quantum dots (blue), CdZnSeS/ZnS quantum dots (green), and CdSe/CdS/ZnS quantum dots (red) that contained oleate and trioctylphosphine ligands that were dispersed in substituted aromatic or heteroaromatic solvents such as 1-methoxynaphthalene, cyclohexylbenzene, 3-isopropylbiphenyl, benzyl benzoate, 1-tetralone, or 3-phenoxytoluene. However, it was discovered that red InP/ZnSe/ZnS quantum dots comprising organic ligands did not completely dissolve in most of these solvents. Results of solubility testing of two different types of red InP/ZnSe/ZnS quantum dots—quantum dots comprising organic ligands and quantum dots comprising inorganic ligands—is shown in TABLE 1.

TABLE 1

Solubility testing of red InP/ZnSe/ZnS quantum dots

| Solvent | Organic Ligand QD | Inorganic Ligand QD |
| --- | --- | --- |
| 1-Methylnaphthalene | Turbid | Turbid |
| 1-Methoxynaphthalene:Hexadecane (9:1) | Clear | Turbid |

TABLE 1-continued

Solubility testing of red InP/ZnSe/ZnS quantum dots

| Solvent | Organic Ligand QD | Inorganic Ligand QD |
| --- | --- | --- |
| 1-Methoxy napthalene | Turbid | — |
| 3-Phenoxytoluene | Turbid | Turbid |
| Dibenzyl ether | Turbid | — |
| Hexyl benzoate | Turbid | Turbid |
| Octylbenzene | Clear | Clear |
| Hexadecane | Clear | Clear |

Quantum dots typically contain native organic ligands such as oleate, octanethiol, and trioctylphosphine ligands that are introduced during the shell synthesis. It has been found that these native ligands can be exchanged through a ligand exchange process with inorganic ligands. In spin-coated devices, both types of quantum dots are processed from the low-boiling point alkane solvent octane. Quantum dots comprising inorganic ligands (after ligand exchange) show longer operating lifetime in devices containing an emissive layer and are therefore more desirable in production of an ink for use in preparing an emissive layer. A fully dispersed colloidal solution is clear, whereas a turbid mixture indicates agglomeration of quantum dots. An ink for use in preparing an emissive layer requires that the quantum dots be fully dispersed to prevent the inkjet nozzle from clogging and to enable smooth film formation. The solubility testing results shown in TABLE 1 show that only alkane (e.g., hexadecane) or alkylbenzene (e.g., octylbenzene) solvents were able to disperse both quantum dots comprising native organic ligands and inorganic ligands (after ligand exchange). In printing tests on a Fujifilm Dimatrix DMP-2831 printer, it was found that a quantum dot ink prepared using only octylbenzene as solvent resulted in wetting of the nozzle plate due to the relatively low surface tension and viscosity, and is thus not suitable as an ink.

The present disclosure is directed to a method of replacing a first ligand on a nanostructure with a second ligand. In some embodiments, the second ligand is an inorganic ligand. In some embodiments, the nanostructure is a quantum dot.

In some embodiments, the present disclosure is directed to a method of replacing a first ligand on a nanostructure with a second ligand comprising:
admixing a reaction mixture comprising a population of nanostructures having a first ligand bound to the nanostructure and at least one second ligand, such that the second ligand displaces the first ligand and becomes bound to the nanostructure.

In some embodiments, the nanostructure is a quantum dot.

In some embodiments, the admixing is performed at a temperature between about 0° C. and about 200° C., about 0° C. and about 150° C., about 0° C. and about 100° C., about 0° C. and about 80° C., about 20° C. and about 200° C., about 20° C. and about 150° C., about 20° C. and about 100° C., about 20° C. and about 80° C., about 50° C. and about 200° C., about 50° C. and about 150° C., about 50° C. and about 100° C., about 50° C. and about 80° C., about 80° C. and about 200° C., about 80° C. and about 150° C., about 80° C. and about 100° C., about 100° C. and about 200° C., about 100° C. and about 150° C., or about 150° C. and about 200° C. In some embodiments, the admixing is performed at a temperature between about 20° C. and about 100° C. In some embodiments, the admixing is performed at a temperature of about 22° C. In some embodiments, the admixing is performed at a temperature of about 70° C.

In some embodiments, the admixing is performed over a period of between about 1 minute and about 6 hours, about 1 minute and about 2 hours, about 1 minute and about 1 hour, about 1 minute and about 40 minutes, about 1 minute and about 30 minutes, about 1 minute and about 20 minutes, about 1 minute and about 10 minutes, about 10 minutes and about 6 hours, about 10 minutes and about 2 hours, about 10 minutes and about 1 hour, about 10 minutes and about 40 minutes, about 10 minutes and about 30 minutes, about 10 minutes and about 20 minutes, about 20 minutes and about 6 hours, about 20 minutes and about 2 hours, about 20 minutes and about 1 hour, about 20 minutes and about 40 minutes, about 20 minutes and about 30 minutes, about 30 minutes and about 6 hours, about 30 minutes and about 2 hours, about 30 minutes and about 1 hour, about 30 minutes and about 40 minutes, about 40 minutes and about 6 hours, about 40 minutes and about 2 hours, about 40 minutes and about 1 hour, about 1 hour and about 6 hours, about 1 hour and about 2 hours, or about 2 hours and about 6 hours.

In some embodiments, the reaction mixture further comprises a solvent. In some embodiments, the solvent is selected from the group consisting of chloroform, acetone, butanone, tetrahydrofuran, 2-methyltetrahydrofuran, ethylene glycol monoethyl ether, ethylene glycol monopropyl ether, ethylene glycol monobutyl ether, diethylene glycol diethyl ether, methyl isobutyl ketone, monomethyl ether glycol ester, gamma-butyrolactone, methylacetic-3-ethyl ether, butyl carbitol, butyl carbitol acetate, propanediol monomethyl ether, propanediol monomethyl ether acetate, cyclohexane, toluene, xylene, isopropyl alcohol, N-methylformamide, and combinations thereof. In some embodiments, the solvent is toluene. In some embodiments, the solvent is N-methylformamide. In some embodiments, the solvent is a mixture of toluene and N-methylformamide.

The percentage of second ligands that are bound to a nanostructure in a population of nanostructures can be measured by $^1$H NMR, wherein the bound ligands are calculated using: (bound second ligands)/(bound+free second ligands).

In some embodiments, the mole percentage of second ligands bound to a nanostructures is between about 20% and about 100%, about 20% and about 80%, about 20% and about 60%, about 20% and about 40%, about 25% and about 100%, about 25% and about 80%, about 25% and about 60%, about 25% and about 40%, about 30% and about 100%, about 30% and about 80%, about 30% and about 60%, about 30% and about 40%, about 40% and about 100%, about 40% and about 80%, about 40% and about 60%, about 60% and about 100%, about 60% and about 80%, or about 80% and about 100%.

First Ligands

In some embodiments, each shell is synthesized in the presence of at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the core synthesis and for the shell synthesis are the same. In some embodiments, the ligand(s) for the core synthesis and for the shell synthesis are different. Following synthesis, any ligand on the surface of the nanostructures can be exchanged for a different ligand with other desirable properties. Examples of ligands are disclosed in U.S. Pat. Nos. 7,572,395, 8,143,703, 8,425,803, 8,563,133, 8,916,064, 9,005,480, 9,139,770, and 9,169,435, and in U.S. Patent Application Publication No. 2008/0118755.

In some embodiments, the first ligand is a fatty acid selected from the group consisting of lauric acid, caproic acid, myristic acid, palmitic acid, stearic acid, and oleic acid. In some embodiments, the first ligand is an organic phosphine or an organic phosphine oxide selected from trioctylphosphine oxide, trioctylphosphine, diphenylphosphine, triphenylphosphine oxide, and tributylphosphine oxide. In some embodiments, the first ligand is an amine selected from the group consisting of dodecylamine, oleylamine, hexadecylamine, dioctylamine, and octadecylamine. In some embodiments, the first ligand is trioctylphosphine, trioctylphosphine oxide, trihydroxypropyl phosphine, tributylphosphine, tridodecylphosphine, dibutyl phosphite, tributyl phosphite, octadecyl phosphite, trilauryl phosphite, didodecyl phosphite, triisodocyl phosphite, bis(2-ethylhexyl)phosphate, tridecyl phosphate, hexadecylamine, oleylamine, octadecylamine, dioctadecylamine, octacosamine, bis(2-ethylhexyl)amine, octylamine, dioctylamine, trioctylamine, dodecylamine, didodecylamine, hexadecylamine, phenyl phosphonic acid, hexylphosphoric acid, tetradecylphosphonic acid, octyl phosphoric acid, n-octadecylphosphonic acid, propenyldiphosphonic acid, dioctyl ether, diphenyl ether, octyl mercaptan, dodecyl mercaptan, oleate, or octanethiol. In some embodiments, the first ligand is oleate, trioctylphosphine, or octanethiol.

Second Ligands

In some embodiments, the second ligand is an inorganic ligand. In some embodiments, the second ligand comprises an inorganic anion and an organic cation.

In some embodiments, the second ligand comprises an inorganic anion. In some embodiments, the inorganic anion comprises a metal. In some embodiments, the inorganic anion comprises a halometallate anion. In some embodiments, the halometallate anion is a bromometallate anion, a chlorometallate anion, a fluorometallate anion, or an iodometallate anion.

In some embodiments, the halometallate anion is represented by one of Formula (I) $MX_3^-$, Formula (II) $MX_{4-x}Y_x^-$, or Formula (III) $MX_{4-x}Y_x^{2-}$, wherein:

M is selected from the group consisting of Zn, Cd, Hg, Cu, Ag, and Au;

X is selected from the group consisting of Br, Cl, F, and I;

Y is selected from the group consisting of Br, Cl, F, and I; and x is 0, 1, or 2.

In some embodiments, the halometallate anion is a halozincate anion. In some embodiments, the halozincate anion is a $ZnBr_3^-$ anion, a $ZnCl_3^-$ anion, a $ZnF_3^-$ anion, a $ZnI_3^-$ anion, a $ZnBr_4^{2-}$ anion, a $ZnCl_4^{2-}$ anion, a $ZnF_4^{2-}$ anion, a $ZnI_4^{2-}$ anion, or a $ZnCl_2F_2^{2-}$ anion.

In some embodiments, the second ligand comprises an organic cation. In some embodiments, the organic cation is selected from the group consisting of a tetraalkylammonium cation, an alkylphosphonium cation, a formamidinium cation, a guanidinium cation, an imidazolium cation, and a pyridinium cation.

In some embodiments, the organic cation is a tetraalkylammonium cation selected from the group consisting of dioctadecyldimethylammonium, dihexadecyldimethylammonium, ditetradecyldimethylammonium, didodecyldimethylammonium, didecyldimethylammonium, dioctyldimethylammonium, bis(ethylhexyl)dimethylammonium, octadecyltrimethylammonium, hexadecyltrimethylammonium, tetradecyltrimethylammonium, dodecyltrimethylammonium, decyltrimethylammonium, octyltrimethylammonium, tetrabutylammonium, tetrapropylammonium, diisopropyldimethylammonium, tetraethylammonium, and tetramethylammonium. In some embodiments, the organic cation is didecyldimethylammonium. In some embodiments, the organic cation is tetrabutylammonium. In some embodiments, the organic cation is oleyltrimethylammonium, phenylethyltrimethylammonium, benzyltrimethylammonium, phenyltrimethylammonium, benzylhexadecyldimethylammonium, benzyltetradecyldimethylammonium, benzyldodecyldimethylammonium, benzyldecyldimethylammonium, benzyloctyldimethylammonium, benzyltributylammonium, or benzyltriethylammonium.

In some embodiments, the organic cation is an alkylphosphonium cation and is selected from the group consisting of tetraphenylphosphonium, dimethyldiphenylphosphonium, methyltriphenoxyphosphonium, hexadecyltributylphosphonium, octyltributylphosphonium, tetradecyltrihexylphosphonium, tetrakis(hydroxymethyl)phosphonium, tetraoctylphosphonium, tetrabutylphosphonium, and tetramethylphosphonium.

In some embodiments, the organic cation is a guanidinium cation. In some embodiments, the guanidinium cation is N,N,N',N',N",N"-hexaalkyl guanidinium.

In some embodiments, the organic cation is an imidazolium cation. In some embodiments, the imidazolium cation is 1,3-dialkyl imidazolium or 1,2,3-trialkyl imidazolium.

In some embodiments, the organic cation is a pyridinium cation. In some embodiments, the pyridinium cation is N-alkyl pyridinium.

In some embodiments, the inorganic ligand is tetrabutylammonium tetrafluorozincate or tetrabutylammonium dichlorodifluorozincate.

Organic Solvents

Solvents suitable for inkjet printing of electroluminescent quantum dot light emitting diodes are known to those of skill in the art. In some embodiments, the organic solvent is a substituted aromatic or heteroaromatic solvent described in U.S. Patent Appl. Publication No. 2018/0230321, which is incorporated herein by reference in its entirety.

In some embodiments, the organic solvent used in a nanostructure composition used as an inkjet printing formulation is defined by its boiling point, viscosity, and surface tension. Properties of organic solvents suitable for inkjet printing formulations are shown in TABLE 2.

TABLE 2

Properties of organic solvents for inkjet printing formulations

| Solvent | Boiling Point (° C.) | Viscosity (mPa · s) | Surface tension (dyne/cm) |
|---|---|---|---|
| 1-Methylnaphthalene | 240 | 3.3 | 38 |
| 1-Methoxynaphthalene | 270 | 7.2 | 43 |
| 3-Phenoxytoluene | 271 | 4.8 | 37 |
| Dibenzyl ether | 298 | 8.7 | 39 |
| Benzyl benzoate | 324 | 10.0 | 44 |
| Butyl benzoate | 249 | 2.7 | 34 |
| Hexyl benzoate | 272 | — | — |
| Octylbenzene | 265 | 2.6 | 31 |
| Cyclohexylbenzene | 240 | 2.0 | 34 |
| Hexadecane | 287 | 3.4 | 28 |
| 4-Methylanisole | 179 | — | 29 |

In some embodiments, the organic solvent has a boiling point at 1 atmosphere of between about 150° C. and about 350° C. In some embodiments the organic solvent has a boiling point at 1 atmosphere of between about 150° C. and about 350° C., about 150° C. and about 300° C., about 150° C. and about 250° C., about 150° C. and about 200° C., about 200° C. and about 350° C., about 200° C. and about 300° C., about 200° C. and about 250° C., about 250° C. and about 350° C., about 250° C. and about 300° C., or about 300° C. and about 350° C.

In some embodiments, the organic solvent has a viscosity between about 1 mPa·s and about 15 mPa·s. In some embodiments, the organic solvent has a viscosity between about 1 mPa·s and about 15 mPa·s, about 1 mPa·s and about 10 mPa·s, about 1 mPa·s and about 8 mPa·s, about 1 mPa·s and about 6 mPa·s, about 1 mPa·s and about 4 mPa·s, about 1 mPa·s and about 2 mPa·s, about 2 mPa·s and about 15 mPa·s, about 2 mPa·s and about 10 mPa·s, about 2 mPa·s and about 8 mPa·s, about 2 mPa·s and about 6 mPa·s, about 2 mPa·s and about 4 mPa·s, about 4 mPa·s and about 15 mPa·s, about 4 mPa·s and about 10 mPa·s, about 4 mPa·s and about 8 mPa·s, about 4 mPa·s and about 6 mPa·s, about 6 mPa·s and about 15 mPa·s, about 6 mPa·s and about 10 mPa·s, about 6 mPa·s and about 8 mPa·s, about 8 mPa·s and about 15 mPa·s, about 8 mPa·s and about 10 mPa·s, or about 10 mPa·s and about 15 mPa·s.

In some embodiments, the organic solvent has a surface tension of between about 20 dyne/cm and about 50 dyne/cm. In some embodiments, the organic solvent has a surface tension of between about 20 dyne/cm and about 50 dyne/cm, about 20 dyne/cm and about 40 dyne/cm, about 20 dyne/cm and about 35 dyne/cm, about 20 dyne/cm and about 30 dyne/cm, about 20 dyne/cm and about 25 dyne/cm, about 25 dyne/cm and about 50 dyne/cm, about 25 dyne/cm and about 40 dyne/cm, about 25 dyne/cm and about 35 dyne/cm, about 25 dyne/cm and about 30 dyne/cm, about 30 dyne/cm and about 50 dyne/cm, about 30 dyne/cm and about 40 dyne/cm, about 30 dyne/cm and about 35 dyne/cm, about 35 dyne/cm and about 50 dyne/cm, about 35 dyne/cm and about 40 dyne/cm, or about 40 dyne/cm and about 50 dyne/cm.

In some embodiments, the organic solvent used in the nanostructure composition is an alkylnaphthalene, an alkoxynaphthalene, an alkylbenzene, an aryl, an alkyl-substituted benzene, a cycloalkylbenzene, a $C_9$-$C_{20}$ alkane, a diarylether, an alkyl benzoate, an aryl benzoate, or an alkoxy-substituted benzene.

In some embodiments, the organic solvent used in a nanostructure composition is 1-tetralone, 3-phenoxytoluene, acetophenone, 1-methoxynaphthalene, n-octylbenzene, n-nonylbenzene, 4-methylanisole, n-decylbenzene, p-diisopropylbenzene, pentylbenzene, tetralin, cyclohexylbenzene, chloronaphthalene, 1,4-dimethylnaphthalene, 3-isopropylbiphenyl, p-methylcumene, dipentylbenzene, o-diethylbenzene, m-diethylbenzene, p-diethylbenzene, 1,2,3,4-tetramethylbenzene, 1,2,3,5-tetramethylbenzene, 1,2,4,5-tetrametylbenzene, butylbenzene, dodecylbenzene, 1-methylnaphthalene, 1,2,4-trichlorobenzene, diphenyl ether, diphenylmethane, 4-isopropylbiphenyl, benzyl benzoate, 1,2-bi(3,4-dimethylphenyl)ethane, 2-isopropylnaphthalene, dibenzyl ether, or a combination thereof. In some embodiments, the organic solvent used in a nanostructure composition is 1-methylnaphthalene, n-octylbenzene, 1-methoxynapththalene, 3-phenoxytoluene, cyclohexylbenzene, 4-methylanisole, n-decylbenzene, or a combination thereof.

In some embodiments, the organic solvent is an anhydrous organic solvent. In some embodiments, the organic solvent is a substantially anhydrous organic solvent.

In some embodiments, the weight percentage of organic solvent in the nanostructure composition is between about 70% and about 99%. In some embodiments, the weight percentage of organic solvent in the nanostructure composition is between about 70% and about 99%, about 70% and about 98%, about 70% and about 95%, about 70% and about 90%, about 70% and about 85%, about 70% and about 80%, about 70% and about 75%, about 75% and about 99%, about 75% and about 98%, about 75% and about 95%, about 75% and about 90%, about 75% and about 85%, about 75% and about 80%, about 80% and about 99%, about 80% and about 98%, about 80% and about 95%, about 80% and about 90%, about 80% and about 85%, about 85% and about 99%, about 85% and about 98%, about 85% and about 95%, about 85% and about 90%, about 90% and about 99%, about 90% and about 98%, about 90% and about 95%, about 95% and about 99%, about 95% and about 98%, or about 98% and about 99%. In some embodiments, the weight percentage of organic solvent in the nanostructure composition is between about 95% and about 99%.

Poly(Alkene Oxide) Additive

In some embodiments, a poly(alkylene oxide) additive comprises a poly(alkylene oxide) backbone. In some embodiments, the poly(alkylene oxide) additive comprises at least one functional group attached to the poly(alkylene oxide) backbone. In some embodiments, the at least one functional group can bind to II-VI nanocrystal surfaces as a neutral L-type binding ligand (e.g., R—COOH). In some embodiments, the at least one functional group can bind to II-VI nanocrystal surfaces as an electron donating X-type ligand (e.g., R—COO⁻).

In some embodiments, the poly(alkylene oxide) additive has at least one functional group. In some embodiments, the at least one functional group is —OH, —NH$_2$, —NH$_3^+$, —N$_3$, —C(=O)OR$^3$, —P(=O)(OR$^4$)$_3$, or —P(R$^5$)$_4$.

In some embodiments, the poly(alkylene oxide) additive is a mixture of a functional group terminated poly(alkylene oxide), a copolymer of alkylene oxides, and combinations thereof. In some embodiments, the functional group terminated poly(alkylene oxide) comprises a copolymer of alkylene oxides. In some embodiments, the copolymer is a random copolymer or a block copolymer. In some embodiments, the block copolymer is a diblock copolymer or a triblock copolymer. In some embodiments, the copolymer is based on a propylene oxide (PO), an ethylene oxide (EO), or a mixture of PO and EO. In some embodiments, the copolymer is a mixture of PO and EO.

In some embodiments, the poly(alkylene oxide) additive comprises a random copolymer of ethylene oxide and propylene oxide, a poly(ethylene oxide)-poly(propylene oxide) diblock copolymer, a poly(ethylene oxide)-poly(propylene oxide)-poly(ethylene oxide) triblock copolymer, a poly(propylene oxide)-poly(ethylene oxide)-poly(propylene oxide) triblock copolymer, or combinations thereof.

In some embodiments, the poly(alkylene oxide) additive comprises a copolymer of PO and EO. In some embodiments, the ratio of ethylene oxide groups to propylene oxide groups is sufficiently high so that the poly(alkylene oxide) ligand has a high degree of hydrophilicity. In some embodiments, the ratio of ethylene oxide groups to propylene oxide groups is low enough that the ligand has the desired resiliency. In some embodiments, the ratio of ethylene oxide groups:propylene oxide groups is between about 15:1 and about 1:15, about 15:1 and about 1:10, about 15:1 and about 1:5, about 10:1 and about 1:15, about 10:1 and about 1:10, about 10:1 and 1:5, about 5:1 and 1:15, about 5:1 and 1:10, or about 5:1 and 1:5.

In some embodiments, the poly(alkylene oxide) additive has the structure of Formula IV:

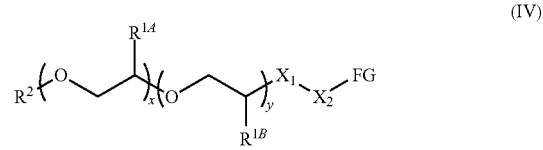

wherein:
x is 1 to 100;
y is 0 to 100;
$R^{1A}$ and $R^{1B}$ independently are H or $C_{1-20}$ alkyl;
$R^2$ is $C_{1-20}$ alkyl;
$X_1$ is a bond or $C_{1-12}$ alkyl;
$X_2$ is a bond, —O—, —OC(=O)—, or amido;
FG is —OH, —NH$_2$, —NH$_4^+$, —N$_3$, —C(=O)OR$^3$, —P(=O)(OR$^4$)$_3$, or —P(R$^5$)$_4$;
$R^3$ is H, $C_{1-20}$ alkyl, or $C_{6-14}$ aryl;
$R^4$ is independently H, $C_{1-20}$ alkyl, or $C_{6-14}$ aryl; and
$R^5$ is independently H, $C_{1-20}$ alkyl or $C_{6-14}$ aryl.

In some embodiments, x is 1 to 100, 1 to 50, 1 to 20, 1 to 10, 1 to 5, 5 to 100, 5 to 50, 5 to 20, 5 to 10, 10 to 100, 10 to 50, 10 to 20, 20 to 100, 20 to 50, or 50 to 100. In some embodiments, x is 10 to 50. In some embodiments, x is 10 to 20. In some embodiments, x is 1. In some embodiments, x is 19. In some embodiments, x is 6. In some embodiments, x is 10.

The values for x are to be understood as modified by the word "about." Therefore, a value of x=1 is understood to mean x=1±0.1. For example a value of x=1 is understood to mean 0.9 to 1.1.

In some embodiments, y is 1 to 100, 1 to 50, 1 to 20, 1 to 10, 1 to 5, 5 to 100, 5 to 50, 5 to 20, 5 to 10, 10 to 100, 10 to 50, 10 to 20, 20 to 100, 20 to 50, or 50 to 100. In some embodiments, y is 1 to 30. In some embodiments, y is 1 to 10. In some embodiments, y is 9. In some embodiments, y is 3. In some embodiments, y is 29. In some embodiments, y is 10.

The values for y are to be understood as modified by the word "about." Therefore, a value of y=1 is understood to mean y=1±0.1. For example a value of y=1 is understood to mean 0.9 to 1.1.

In some embodiments, the ratio of x to y is between about 15:1 and about 1:15, about 15:1 and about 1:10, about 15:1 and about 1:5, about 10:1 and about 1:15, about 10:1 and about 1:10, about 10:1 and about 1:5, about 5:1 and about 1:15, about 5:1 and about 1:10, or about 5:1 and about 1:5. In some embodiments, the ratio of x to y is about 1:9. In some embodiments, the ratio of x to y is about 19:3. In some embodiments, the ratio of x to y is about 6:29. In some embodiments, the ratio of x to y is about 31:10.

In some embodiments, $R^{1A}$ is H. In some embodiments, $R^{1A}$ is $C_{1-20}$ alkyl. In some embodiments, $R^{1A}$ is $C_{1-10}$ alkyl. In some embodiments, $R^{1A}$ is $C_{1-5}$ alkyl. In some embodiments, $R^{1A}$ is —CH$_3$.

In some embodiments, $R^{1B}$ is H. In some embodiments, $R^{1B}$ is $C_{1-20}$ alkyl. In some embodiments, $R^{1B}$ is $C_{1-10}$ alkyl. In some embodiments, $R^{1B}$ is $C_{1-5}$ alkyl. In some embodiments, $R^{1B}$ is —CH$_3$.

In some embodiments, $R^{1A}$ is H and $R^{1B}$ are —CH$_3$. In some embodiments, $R^{1A}$ is —CH$_3$ and $R^{1B}$ is H. In some embodiments, $R^{1A}$ is H and $R^{1B}$ is H. In some embodiments, $R^{1A}$ is —CH$_3$ and $R^{1B}$ is —CH$_3$.

In some embodiments, $R^2$ is $C_{1-20}$ alkyl. In some embodiments, $R^2$ is $C_{1-10}$ alkyl. In some embodiments, $R^2$ is $C_{1-5}$ alkyl. In some embodiments, $R^2$ is —CH$_2$CH$_3$.

In some embodiments, $X_1$ is a bond. In some embodiments, $X_1$ is $C_{1-12}$ alkyl.

In some embodiments, $X_2$ is a bond. In some embodiments, $X_2$ is —OC(=O)—. In some embodiments, $X_2$ is amido.

In some embodiments, FG is —OH. In some embodiments, FG is —$NH_2$. In some embodiments, FG is —$NH_4^+$. In some embodiments, FG is —$N_3$. In some embodiments, FG is —C(=O)$OR^3$. In some embodiments, FG is —P(=O)$(OR^4)_3$. In some embodiments, FG is —P$(R^5)_4$.

In some embodiments, $R^3$ is H. In some embodiments, $R^3$ is $C_{1-20}$ alkyl. In some embodiments, $R^3$ is $C_{1-10}$ alkyl. In some embodiments, $R^3$ is $C_{1-5}$ alkyl. In some embodiments, $R^3$ is —$CH_3$. In some embodiments, $R^3$ is $C_{3-8}$ cycloalkyl. In some embodiments, $R^3$ is $C_{6-14}$ aryl. In some embodiments, $R^3$ is phenyl, naphthyl, phenanthryl, anthracyl, indenyl, azulenyl, biphenyl, biphenylenyl, or fluorenyl.

In some embodiments, $R^4$ is H. In some embodiments, $R^4$ is $C_{1-20}$ alkyl. In some embodiments, $R^4$ is $C_{1-10}$ alkyl. In some embodiments, $R^4$ is $C_{1-5}$ alkyl. In some embodiments, $R^4$ is —$CH_3$. In some embodiments, $R^4$ is $C_{3-8}$ cycloalkyl. In some embodiments, $R^4$ is $C_{6-14}$ aryl. In some embodiments, $R^4$ is phenyl, naphthyl, phenanthryl, anthracyl, indenyl, azulenyl, biphenyl, biphenylenyl, or fluorenyl.

In some embodiments, $R^5$ is H. In some embodiments, $R^5$ is $C_{1-20}$ alkyl. In some embodiments, $R^5$ is $C_{1-10}$ alkyl. In some embodiments, $R^5$ is $C_{1-5}$ alkyl. In some embodiments, $R^5$ is —$CH_3$. In some embodiments, $R^5$ is $C_{3-8}$ cycloalkyl. In some embodiments, $R^5$ is $C_{6-14}$ aryl. In some embodiments, $R^5$ is phenyl, naphthyl, phenanthryl, anthracyl, indenyl, azulenyl, biphenyl, biphenylenyl, or fluorenyl.

In some embodiments, wherein $R^{1A}$ is H and FG is —$NH_2$ in Formula IV, the poly(alkylene oxide) ligand has the structure of Formula V:

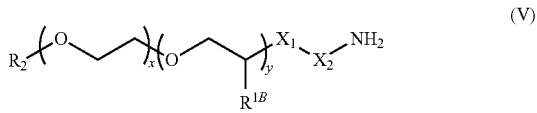

wherein:
x is 1 to 100;
y is 0 to 100;
$X_1$ is a bond or $C_{1-12}$ alkylene;
$X_2$ is a bond, —O—, —OC(=O)—, or amido;
$R^{1B}$ is H or $C_{1-20}$ alkyl; and
$R^2$ is $C_{1-20}$ alkyl.

In some embodiments, x is 1 to 100, 1 to 50, 1 to 20, 1 to 10, 1 to 5, 5 to 100, 5 to 50, 5 to 20, 5 to 10, 10 to 100, 10 to 50, 10 to 20, 20 to 100, 20 to 50, or 50 to 100. In some embodiments, y is 1 to 100, 1 to 50, 1 to 20, 1 to 10, 1 to 5, 5 to 100, 5 to 50, 5 to 20, 5 to 10, 10 to 100, 10 to 50, 10 to 20, 20 to 100, 20 to 50, or 50 to 100.

In some embodiments, the ratio of x to y is between about 15:1 and about 1:15, about 15:1 and about 1:10, about 15:1 and about 1:5, about 10:1 and 1:15, about 10:1 and 1:10, about 10:1 and 1:5, about 5:1 and 1:15, about 5:1 and 1:10, or about 5:1 and 1:5.

In some embodiments, $R^{1B}$ is H. In some embodiments, $R^{1B}$ is $C_{1-20}$ alkyl. In some embodiments, $R^{1B}$ is $C_{1-10}$ alkyl. In some embodiments, $R^{1B}$ is $C_{1-5}$ alkyl. In some embodiments, $R^{1B}$ is —$CH_3$.

In some embodiments, $R^2$ is $C_{1-20}$ alkyl. In some embodiments, $R^2$ is $C_{1-10}$ alkyl.

In some embodiments, $R^2$ is $C_{1-5}$ alkyl. In some embodiments, $R^2$ is —$CH_2CH_3$.

In some embodiments, $X_1$ is a bond. In some embodiments, $X_1$ is $C_{1-12}$ alkyl.

In some embodiments, $X_2$ is a bond. In some embodiments, $X_2$ is —OC(=O)—. In some embodiments, $X_2$ is amido.

In some embodiments, wherein $R^{1A}$ is H, $R^{1B}$ is —$CH_3$, $X_1$ is a bond, $X_2$ is a bond, and FG is —$NH_2$ in Formula IV, the poly(alkylene oxide) ligand has the structure of Formula VI:

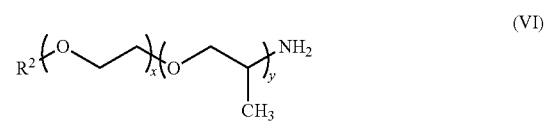

wherein:
x is 1 to 100;
y is 0 to 100; and
$R^2$ is $C_{1-20}$ alkyl.

In some embodiments, x is 1 to 100, 1 to 50, 1 to 20, 1 to 10, 1 to 5, 5 to 100, 5 to 50, 5 to 20, 5 to 10, 10 to 100, 10 to 50, 10 to 20, 20 to 100, 20 to 50, or 50 to 100. In some embodiments, x is 10 to 50. In some embodiments, x is 10 to 20. In some embodiments, x is 1. In some embodiments, x is 19. In some embodiments, x is 6. In some embodiments, x is 10.

In some embodiments, $R^2$ is $C_{1-20}$ alkyl. In some embodiments, $R^2$ is $C_{1-10}$ alkyl.

In some embodiments, $R^2$ is $C_{1-5}$ alkyl. In some embodiments, $R^2$ is —$CH_2CH_3$.

In some embodiments, the amine-terminated polymer is a commercially available amine-terminated polymer from Huntsman Petrochemical Corporation. In some embodiments, the amine-terminated polymer of formula (VI) has x=1, y=9, and $R^2$=—$CH_3$ and is JEFFAMINE M-600 (Huntsman Petrochemical Corporation, Texas). JEFFAMINE M-600 has a molecular weight of approximately 600. In some embodiments, the amine-terminated polymer of formula (III) has x=19, y=3, and $R^2$=-$CH_3$ and is JEFFAMINE M-1000 (Huntsman Petrochemical Corporation, Texas). JEFFAMINE M-1000 has a molecular weight of approximately 1,000. In some embodiments, the amine-terminated polymer of formula (III) has x=6, y=29, and $R^2$=-$CH_3$ and is JEFFAMINE M-2005 (Huntsman Petrochemical Corporation, Texas). JEFFAMINE M-2005 has a molecular weight of approximately 2,000. In some embodiments, the amine-terminated polymer of formula (III) has x=31, y=10, and $R^2$=-$CH_3$ and is JEFFAMINE M-2070 (Huntsman Petrochemical Corporation, Texas). JEFFAMINE M-2070 has a molecular weight of approximately 2,000.

In some embodiments, wherein $R^{1A}$ is H and FG is —$N_3$ in Formula IV, the poly(alkylene oxide) ligand has the structure of Formula VII:

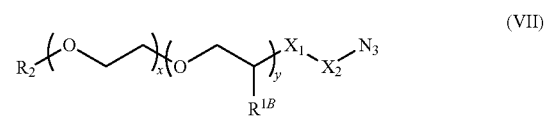

wherein:

x is 1 to 100;

y is 0 to 100;

$X_1$ is a bond or $C_{1-12}$ alkyl;

$X_2$ is a bond, —O—, —OC(=O)—, or amido; and $R^2$ is $C_{1-20}$ alkyl.

In some embodiments, x is 1 to 100, 1 to 50, 1 to 20, 1 to 10, 1 to 5, 5 to 100, 5 to 50, 5 to 20, 5 to 10, 10 to 100, 10 to 50, 10 to 20, 20 to 100, 20 to 50, or 50 to 100. In some embodiments, y is 1 to 100, 1 to 50, 1 to 20, 1 to 10, 1 to 5, 5 to 100, 5 to 50, 5 to 20, 5 to 10, 10 to 100, 10 to 50, 10 to 20, 20 to 100, 20 to 50, or 50 to 100.

In some embodiments, $R^2$ is $C_{1-20}$ alkyl. In some embodiments, $R^2$ is $C_{1-10}$ alkyl.

In some embodiments, $R^2$ is $C_{1-5}$ alkyl. In some embodiments, $R^2$ is —CH$_2$CH$_3$.

In some embodiments, $X_1$ is a bond. In some embodiments, $X_1$ is $C_{1-12}$ alkyl.

In some embodiments, $X_2$ is a bond. In some embodiments, $X_2$ is —OC(=O)—. In some embodiments, $X_2$ is amido.

In some embodiments, wherein $R^{1A}$ is —H, $R^{1B}$ is —H, $X_1$ is a bond, $X_2$ is a bond, and FG is —N$_3$ in Formula IV, the poly(alkylene oxide) ligand has the structure of Formula VIII:

(VIII)

wherein:

x is 1 to 100;

y is 0 to 100; and $R^2$ is $C_{1-20}$ alkyl.

In some embodiments, x is 1 to 100, 1 to 50, 1 to 20, 1 to 10, 1 to 5, 5 to 100, 5 to 50, 5 to 20, 5 to 10, 10 to 100, 10 to 50, 10 to 20, 20 to 100, 20 to 50, or 50 to 100. 1. In some embodiments, x is 19. In some embodiments, x is 6. In some embodiments, x is 10.

In some embodiments, $R^2$ is $C_{1-20}$ alkyl. In some embodiments, $R^2$ is $C_{1-10}$ alkyl.

In some embodiments, $R^2$ is $C_{1-5}$ alkyl. In some embodiments, $R^2$ is —CH$_2$CH$_3$.

In some embodiments, the azide-terminated polymer is a commercially available azide-terminated polymer available from Sigma-Aldrich such as methoxypolyethylene glycol azide (average $M_n$=2000 (wherein y=1)), methoxypolyethylene glycol azide (average $M_n$=10,000 (wherein y=1)), methoxypolyethylene glycol azide (average $M_n$=2000 (wherein y=1)), O-(2-(azidoethyl)-O'-methyl-triethylene glycol (wherein x=3, y=1), O-(2-(azidoethyl)-O'-methyl-undecaethylene glycol (wherein x=11, y=1), O-(2-(azidoethyl)-O'-methyl-nonaethylene glycol (wherein x=19, y=1), poly(ethylene glycol) methyl ether azide (average $M_n$=400 (wherein y=1)), or poly(ethylene glycol) methyl ether azide (average $M_n$=1,000 (wherein y=1)).

In some embodiments, wherein $R^{1A}$ is —H and FG is —CO$_2$H in Formula IV, the poly(alkylene oxide) ligand has the structure of Formula IX:

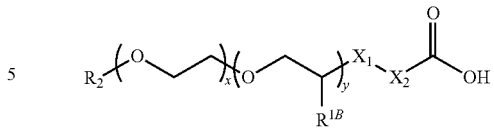

(IX)

wherein:

x is 1 to 100;

y is 0 to 100;

$X_1$ is a bond or $C_{1-12}$ alkyl;

$X_2$ is a bond, —O—, —OC(=O)—, or amido; and $R^2$ is $C_{1-20}$ alkyl.

In some embodiments, x is 1 to 100, 1 to 50, 1 to 20, 1 to 10, 1 to 5, 5 to 100, 5 to 50, 5 to 20, 5 to 10, 10 to 100, 10 to 50, 10 to 20, 20 to 100, 20 to 50, or 50 to 100. In some embodiments, y is 1 to 100, 1 to 50, 1 to 20, 1 to 10, 1 to 5, 5 to 100, 5 to 50, 5 to 20, 5 to 10, 10 to 100, 10 to 50, 10 to 20, 20 to 100, 20 to 50, or 50 to 100.

In some embodiments, $R^2$ is $C_{1-20}$ alkyl. In some embodiments, $R^2$ is $C_{1-10}$ alkyl.

In some embodiments, $R^2$ is $C_{1-5}$ alkyl. In some embodiments, $R^2$ is —CH$_2$CH$_3$.

In some embodiments, $X_1$ is a bond. In some embodiments, $X_1$ is $C_{1-12}$ alkyl.

In some embodiments, $X_2$ is a bond. In some embodiments, $X_2$ is —OC(=O)—. In some embodiments, $X_2$ is amido.

In some embodiments, wherein $R^{1A}$ is —H, $R^{1B}$ is —H, $X_1$ is a bond, $X_2$ is a bond, and FG is —CO$_2$H in Formula IV, the poly(alkylene oxide) ligand has the structure of Formula X:

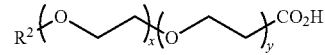

(X)

wherein:

x is 1 to 100;

y is 0 to 100; and $R^2$ is $C_{1-20}$ alkyl.

In some embodiments, x is 1 to 100, 1 to 50, 1 to 20, 1 to 10, 1 to 5, 5 to 100, 5 to 50, 5 to 20, 5 to 10, 10 to 100, 10 to 50, 10 to 20, 20 to 100, 20 to 50, or 50 to 100. In some embodiments, y is 1 to 100, 1 to 50, 1 to 20, 1 to 10, 1 to 5, 5 to 100, 5 to 50, 5 to 20, 5 to 10, 10 to 100, 10 to 50, 10 to 20, 20 to 100, 20 to 50, or 50 to 100.

In some embodiments, $R^2$ is $C_{1-20}$ alkyl. In some embodiments, $R^2$ is $C_{1-10}$ alkyl.

In some embodiments, $R^2$ is $C_{1-5}$ alkyl. In some embodiments, $R^2$ is —CH$_2$CH$_3$.

In some embodiments, the carboxylic acid-terminated polymer of Formula X is a commercially available carboxylic acid-terminated polymer available from Sigma-Aldrich such as methoxypolyethylene glycol propionic acid (average $M_n$=5,000 (wherein y=1).

In some embodiments, wherein $R^{1A}$ is —H and FG is —OH in Formula IV, the poly(alkylene oxide) ligand has the structure of Formula XI:

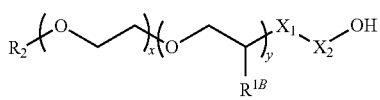

(XI)

wherein:
x is 1 to 100;
y is 0 to 100;
$X_1$ is a bond or $C_{1-12}$ alkyl;
$X_2$ is a bond, —O—, —OC(=O)—, or amido; and
$R^2$ is $C_{1-20}$ alkyl.

In some embodiments, x is 1 to 100, 1 to 50, 1 to 20, 1 to 10, 1 to 5, 5 to 100, 5 to 50, 5 to 20, 5 to 10, 10 to 100, 10 to 50, 10 to 20, 20 to 100, 20 to 50, or 50 to 100. In some embodiments, y is 1 to 100, 1 to 50, 1 to 20, 1 to 10, 1 to 5, 5 to 100, 5 to 50, 5 to 20, 5 to 10, 10 to 100, 10 to 50, 10 to 20, 20 to 100, 20 to 50, or 50 to 100.

In some embodiments, $R^2$ is $C_{1-20}$ alkyl. In some embodiments, $R^2$ is $C_{1-10}$ alkyl.

In some embodiments, $R^2$ is $C_{1-5}$ alkyl. In some embodiments, $R^2$ is —$CH_2CH_3$.

In some embodiments, $X_1$ is a bond. In some embodiments, $X_1$ is $C_{1-12}$ alkyl.

In some embodiments, $X_2$ is a bond. In some embodiments, $X_2$ is —OC(=O)—. In some embodiments, $X_2$ is amido.

In some embodiments, wherein $R^{1A}$ is —H, $R^{1B}$ is —H, $X_1$ is a bond, $X_2$ is a bond, and FG is —OH in Formula IV, the poly(alkylene oxide) ligand has the structure of Formula XII:

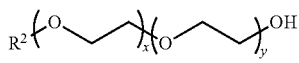

(XII)

wherein:
x is 1 to 100;
y is 0 to 100; and
$R^2$ is $C_{1-20}$ alkyl.

In some embodiments, x is 1 to 100, 1 to 50, 1 to 20, 1 to 10, 1 to 5, 5 to 100, 5 to 50, 5 to 20, 5 to 10, 10 to 100, 10 to 50, 10 to 20, 20 to 100, 20 to 50, or 50 to 100. In some embodiments, y is 1 to 100, 1 to 50, 1 to 20, 1 to 10, 1 to 5, 5 to 100, 5 to 50, 5 to 20, 5 to 10, 10 to 100, 10 to 50, 10 to 20, 20 to 100, 20 to 50, or 50 to 100.

In some embodiments, $R^2$ is $C_{1-20}$ alkyl. In some embodiments, $R^2$ is $C_{1-10}$ alkyl.

In some embodiments, $R^2$ is $C_{1-5}$ alkyl. In some embodiments, $R^2$ is —$CH_2CH_3$.

In some embodiments, the hydroxy-terminated polymer of Formula XII is a commercially available hydroxy-terminated polymer available from Sigma-Aldrich such as poly(ethylene glycol)methyl ether (average $M_n$=550 (wherein y=1), poly(ethylene glycol)methyl ether (average $M_n$=750 (wherein y=1), poly(ethylene glycol)methyl ether (average $M_n$=5,000 (wherein y=1), or poly(ethylene glycol)methyl ether (average $M_n$=10,000 (wherein y=1).

In some embodiments, the weight percentage of poly(alkylene oxide) additive in the nanostructure composition is between about 0.05% and about 2%. In some embodiments, the weight percentage of poly(alkylene oxide) additive in the nanostructure composition is between about 0.05% and about 2%, about 0.05% and about 1.5%, about 0.05% and about 1%, about 0.05% and about 0.5%, about 0.05% and about 0.1%, about 0.1% and about 2%, about 0.1% and about 1.5%, about 0.1% and about 1%, about 0.1% and about 0.5%, about 0.5% and about 2%, about 0.5% and about 1.5%, about 0.5% and about 1%, about 1% and about 2%, about 1% and about 1.5%, or about 1.5% and about 2%. In some embodiments, the weight percentage of nanostructures in the nanostructure composition is between about 0.1% and about 0.5%.

Nanostructure Compositions

In some embodiments, the nanostructure composition further comprises one or more additional components such as surface-active compounds, lubricating agents, wetting agents, dispersing agents, hydrophobing agents, adhesive agents, flow improvers, defoaming agents, deaerators, diluents, auxiliaries, colorants, dyes, pigments, sensitizers, stabilizers, antioxidants, viscosity modifiers, and inhibitors.

In some embodiments, the nanostructure composition described herein is used in the formulation of an electronic device. In some embodiments, the nanostructure composition described herein is used in the formulation of an electronic device selected from the group consisting of a nanostructure film, a display device, a lighting device, a backlight unit, a color filter, a surface light-emitting device, an electrode, a magnetic memory device, and a battery. In some embodiments, the nanostructure composition described herein is used in the formulation of a light-emitting device.

Provided is a process comprising depositing the nanostructure composition to form a layer on a substrate. In some embodiments, the depositing is by inkjet printing. In some embodiments, the process further comprises at least partial removal of the substantially anhydrous organic solvent. In some embodiments, the at least partial removal of the substantially anhydrous organic solvent comprises air drying. In some embodiments, the at least partial removal of the substantially anhydrous organic solvent comprises application of heat. In some embodiments, the substrate is a first conductive layer. In some embodiments, the process further comprises depositing a second conductive layer on the nanostructure composition. In some embodiments, the process further comprises depositing a first transport layer on the first conductive layer, the first transport layer being configured to facilitate the transport of holes from the first conductive layer to the layer comprising the nanostructure composition; and depositing a second transport layer on the layer comprising the nanostructure composition, the second transport layer configured to facilitate the transport of electrons from the second conductive layer to the layer comprising the nanostructure composition. In some embodiments, the nanostructure composition is deposited in a pattern.

Nanostructure Molded Article

In some embodiments, the nanostructure composition is used to form a nanostructure molded article. In some embodiments, the nanostructure molded article is a liquid crystal display (LCD) or a light emitting diode (LED). In some embodiments, the nanostructure composition is used to form the emitting layer of an illumination device. The illumination device can be used in a wide variety of applications, such as flexible electronics, touchscreens, monitors, televisions, cellphones, and any other high definition displays. In some embodiments, the illumination device is a light emitting diode or a liquid crystal display. In some embodiments, the illumination device is a quantum dot light emitting diode (QLED). An example of a QLED is disclosed in U.S. Pat. No. 10,790,411, which is incorporated herein by reference in its entirety.

In some embodiments, the present disclosure provides a light emitting diode comprising:
(a) a first conductive layer;
(b) a second conductive layer; and
(c) an emitting layer between the first conductive layer and the second conductive layer, wherein the emitting layer comprises at least one population of nanostructures, wherein the nanostructures comprise (i) at least one organic solvent; (ii) at least one nanostructure comprising a core and at least one shell, wherein the nanostructure comprises inorganic ligands bound to the surface of the nanostructure; and (iii) at least one poly(alkylene oxide) additive.

In some embodiments, the present disclosure provides a light emitting diode comprising:
(a) a first conductive layer;
(b) a second conductive layer; and
(c) an emitting layer between the first conductive layer and the second conductive layer, wherein the emitting layer comprises at least one population of nanostructures, wherein the nanostructures comprise (i) at least one organic solvent; (ii) at least one nanostructure comprising a core and at least one shell, wherein the nanostructure comprises inorganic ligands bound to the surface of the nanostructure, wherein the inorganic ligands comprise a halometallate anion and an organic cation; and (iii) at least one poly(alkylene oxide) additive.

In some embodiments, the emitting layer is a nanostructure film.

In some embodiments, the light emitting diode comprises a first conductive layer, a second conductive layer, and an emitting layer, wherein the emitting layer is arranged between the first conductive layer and the second conductive layer. In some embodiments, the emitting layer is a thin film.

In some embodiments, the light emitting diode comprises additional layers between the first conductive layer and the second conductive layer such as a hole injection layer, a hole transport layer, and an electron transport layer. In some embodiments, the hole injection layer, the hole transport layer, and the electron transport layer are thin films. In some embodiments, the layers are stacked on a substrate.

When voltage is applied to the first conductive layer and the second conductive layer, holes injected at the first conductive layer move to the emitting layer via the hole injection layer and/or the hole transport layer, and electrons injected from the second conductive layer move to the emitting layer via the electron transport layer. The holes and electrons recombine in the emitting layer to generate excitons.

Making a Nanostructure Layer

In some embodiments, the nanostructure layer can be embedded in a polymeric matrix. As used herein, the term "embedded" is used to indicate that the nanostructure population is enclosed or encased with the polymer that makes up the majority of the components of the matrix. In some embodiments, at least one nanostructure population is suitably uniformly distributed throughout the matrix. In some embodiments, the at least one nanostructure population is distributed according to an application-specific distribution. In some embodiments, the nanostructures are mixed in a polymer and applied to the surface of a substrate.

In some embodiments, a nanostructure composition is deposited to form a nanostructure layer. In some embodiments, a nanostructure composition can be deposited by any suitable method known in the art, including but not limited to painting, spray coating, solvent spraying, wet coating, adhesive coating, spin coating, tape-coating, roll coating, flow coating, inkjet vapor jetting, drop casting, blade coating, mist deposition, or a combination thereof. In some embodiments, a nanostructure composition can be deposited by inkjet printing.

The nanostructure composition can be coated directly onto the desired layer of a substrate. Alternatively, the nanostructure composition can be formed into a solid layer as an independent element and subsequently applied to the substrate. In some embodiments, the nanostructure composition can be deposited on one or more barrier layers.

In some embodiments, the nanostructure layer is cured after deposition. Suitable curing methods include photocuring, such as UV curing, and thermal curing. Traditional laminate film processing methods, tape-coating methods, and/or roll-to-roll fabrication methods can be employed in forming a nanostructure layer.

In some embodiments, the nanostructure compositions are thermally cured to form the nanostructure layer. In some embodiments, the compositions are cured using UV light. In some embodiments, the nanostructure composition is coated directly onto a barrier layer of a nanostructure film, and an additional barrier layer is subsequently deposited upon the nanostructure layer to create the nanostructure film. A support substrate can be employed beneath the barrier film for added strength, stability, and coating uniformity, and to prevent material inconsistency, air bubble formation, and wrinkling or folding of the barrier layer material or other materials. Additionally, one or more barrier layers are preferably deposited over a nanostructure layer to seal the material between the top and bottom barrier layers. Suitably, the barrier layers can be deposited as a laminate film and optionally sealed or further processed, followed by incorporation of the nanostructure film into the particular lighting device. The nanostructure composition deposition process can include additional or varied components, as will be understood by persons of ordinary skill in the art. Such embodiments will allow for in-line process adjustments of the nanostructure emission characteristics, such as brightness and color (e.g., to adjust the quantum dot film white point), as well as the nanostructure film thickness and other characteristics. Additionally, these embodiments will allow for periodic testing of the nanostructure film characteristics during production, as well as any necessary toggling to achieve precise nanostructure film characteristics. Such testing and adjustments can also be accomplished without changing the mechanical configuration of the processing line, as a computer program can be employed to electronically change the respective amounts of mixtures to be used in forming a nanostructure film.

Barrier Layers

In some embodiments, the molded article comprises one or more barrier layers disposed on either one or both sides of the nanostructure layer. Suitable barrier layers protect the nanostructure layer and the molded article from environmental conditions such as high temperatures, oxygen, and moisture. Suitable barrier materials include non-yellowing, transparent optical materials which are hydrophobic, chemically and mechanically compatible with the molded article, exhibit photo- and chemical-stability, and can withstand high temperatures. In some embodiments, the one or more barrier layers are index-matched to the molded article. In some embodiments, the matrix material of the molded article and the one or more adjacent barrier layers are index-matched to have similar refractive indices, such that most of the light transmitting through the barrier layer toward the molded article is transmitted from the barrier layer into the nanostructure layer. This index-matching reduces optical losses at the interface between the barrier and matrix materials.

The barrier layers are suitably solid materials, and can be a cured liquid, gel, or polymer. The barrier layers can comprise flexible or non-flexible materials, depending on the particular application. Barrier layers are preferably planar layers, and can include any suitable shape and surface area configuration, depending on the particular lighting application. In some embodiments, the one or more barrier layers will be compatible with laminate film processing techniques, whereby the nanostructure layer is disposed on at least a first barrier layer, and at least a second barrier layer is disposed on the nanostructure layer on a side opposite the nanostructure layer to form the molded article according to one embodiment. Suitable barrier materials include any suitable barrier materials known in the art. In some embodiments, suitable barrier materials include glasses, polymers, and oxides. Suitable barrier layer materials include, but are not limited to, polymers such as polyethylene terephthalate (PET); oxides such as silicon oxide, titanium oxide, or aluminum oxide (e.g., $SiO_2$, $Si_2O_3$, $TiO_2$, or $Al_2O_3$); and suitable combinations thereof. Preferably, each barrier layer of the molded article comprises at least 2 layers comprising different materials or compositions, such that the multi-layered barrier eliminates or reduces pinhole defect alignment in the barrier layer, providing an effective barrier to oxygen and moisture penetration into the nanostructure layer. The nanostructure layer can include any suitable material or combination of materials and any suitable number of barrier layers on either or both sides of the nanostructure layer. The materials, thickness, and number of barrier layers will depend on the particular application, and will suitably be chosen to maximize barrier protection and brightness of the nanostructure layer while minimizing thickness of the molded article. In preferred embodiments, each barrier layer comprises a laminate film, preferably a dual laminate film, wherein the thickness of each barrier layer is sufficiently thick to eliminate wrinkling in roll-to-roll or laminate manufacturing processes. The number or thickness of the barriers may further depend on legal toxicity guidelines in embodiments where the nanostructures comprise heavy metals or other toxic materials, which guidelines may require more or thicker barrier layers. Additional considerations for the barriers include cost, availability, and mechanical strength.

In some embodiments, the nanostructure film comprises two or more barrier layers adjacent each side of the nanostructure layer, for example, two or three layers on each side or two barrier layers on each side of the nanostructure layer. In some embodiments, each barrier layer comprises a thin glass sheet, e.g., glass sheets having a thickness of about 100 µm, 100 µm or less, or 50 µm or less.

Each barrier layer of the molded article can have any suitable thickness, which will depend on the particular requirements and characteristics of the lighting device and application, as well as the individual film components such as the barrier layers and the nanostructure layer, as will be understood by persons of ordinary skill in the art. In some embodiments, each barrier layer can have a thickness of 50 µm or less, 40 µm or less, 30 µm or less, 25 µm or less, 20 µm or less, or 15 µm or less. In certain embodiments, the barrier layer comprises an oxide coating, which can comprise materials such as silicon oxide, titanium oxide, and aluminum oxide (e.g., Sift, $Si_2O_3$, $TiO_2$, or $Al_2O_3$). The oxide coating can have a thickness of about 10 µm or less, 5 µm or less, 1 µm or less, or 100 nm or less. In certain embodiments, the barrier comprises a thin oxide coating with a thickness of about 100 nm or less, 10 nm or less, 5 nm or less, or 3 nm or less. The top and/or bottom barrier can consist of the thin oxide coating, or may comprise the thin oxide coating and one or more additional material layers.

Molded Articles with Improved Properties

In some embodiments, a molded article prepared using the nanostructure compositions described herein shows an EQE of between about 1.5% and about 20%, about 1.5% and about 15%, about 1.5% and about 12%, about 1.5% and about 10%, about 1.5% and about 8%, about 1.5% and about 4%, about 1.5% and about 3%, about 3% and about 20%, about 3% and about 15%, about 3% and about 12%, about 3% and about 10%, about 3% and about 8%, about 8% and about 20%, about 8% and about 15%, about 8% and about 12%, about 8% and about 10%, about 10% and about 20%, about 10% and about 15%, about 10% and about 12%, about 12% and about 20%, about 12% and about 15%, or about 15% and about 20%. In some embodiments, the nanostructure composition comprises quantum dots. In some embodiments, the molded article is a light emitting diode.

The photoluminescence spectrum of the molded articles can cover essentially any desired portion of the spectrum. In some embodiments, the molded articles have a emission maximum between 300 nm and 750 nm, 300 nm and 650 nm, 300 nm and 550 nm, 300 nm and 450 nm, 450 nm and 750 nm, 450 nm and 650 nm, 450 nm and 550 nm, 450 nm and 750 nm, 450 nm and 650 nm, 450 nm and 550 nm, 550 nm and 750 nm, 550 nm and 650 nm, or 650 nm and 750 nm. In some embodiments, the molded articles have an emission maximum of between 450 nm and 550 nm. In some embodiments, the molded articles have an emission maximum of between 550 nm and 650 nm.

The size distribution of the molded articles prepared using the nanostructure compositions described herein can be relatively narrow. In some embodiments, the molded articles prepared using the nanostructure compositions described herein have a full width at half-maximum of between about 10 nm and about 50 nm, about 10 nm and about 45 nm, about 10 nm and about 35 nm, about 10 nm and about 30 nm, about 10 nm and about 25 nm, about 10 nm and about 22 nm, about 10 nm and about 20 nm, about 10 nm and about 15 nm, about 15 nm and about 50 nm, about 15 nm and about 45 nm, about 15 nm and about 35 nm, about 15 nm and about 30 nm, about 15 nm and about 25 nm, about 15 nm and about 22 nm, about 15 nm and about 20 nm, about 20 nm and about 50 nm, about 20 nm and about 45 nm, about 20 nm and about 35 nm, about 20 nm and about 30 nm, about 20 nm and about 25 nm, about 20 nm and about 22 nm, about 22 nm and about 50 nm, about 22 nm and about 45 nm, about 22 nm and about 35 nm, about 22 nm and about 30 nm, about 22 nm and about 25 nm, about 25 nm and about 50 nm, about 25 nm and about 45 nm, about 25 nm and about 35 nm, about 25 nm and about 30 nm, about 30 nm and about 50 nm, about 30 nm and about 45 nm, about 30 nm and about 35 nm, about 35 nm and about 50 nm, about 35 nm and about 45 nm, or about 45 nm and about 50 nm. In some embodiments, the molded articles prepared using the nanostructure compositions described herein have a full width at half-maximum of between about 15 nm and about 30 nm.

EXAMPLES

The following examples are illustrative and non-limiting, of the products and methods described herein. Suitable modifications and adaptations of the variety of conditions, formulations, and other parameters normally encountered in the field and which are obvious to those skilled in the art in view of this disclosure are within the spirit and scope of the invention.

Example 1

Quantum Dot Synthesis

Quantum dots were synthesized using procedures described in U.S. Patent Appl. Publication Nos. 2017/0066965 and 2017/0306227 and in U.S. Pat. No. 11,753,587.

Example 2

Ligand Exchange

Carboxylate ligands were exchanged for halozincate ligands (e.g., tetrachlorozincate, tetrafluorozincate, or dichlorodifluorozincate) which were expected to undergo electrochemical oxidation at a higher voltage than carboxylate ligands. In a subsequent step, potassium counterions of the tetrafluorozincate-capped nanostructures were exchanged for tetraalkylammonium cations, which enabled solubility in non-polar solvents and made the exchanged nanostructures compatible with typical fabrication processes for preparing electroluminescent quantum dot light emitting diodes. FIG. 1 is a flow chart showing ligand exchange of carboxylate-capped nanostructures with tetrafluorozincate-capped nanostructures with tetraalkylammonium anions or didecyldimethylammonium anions.

The ligand exchange process is shown in FIG. 1. In the first step, t-butylammonium fluoride (TBAF) and zinc difluoride ($ZnF_2$) were admixed in N-methylformamide (NMF) at room temperature to produce the dianionic halozincate $TBA_2ZnF_4$. In the second step, the dianionic halozincate $TBA_2ZnF_4$ and oleate-capped quantum dots (QD-OA) were admixed in a mixture of toluene and NMF at 70° C. to produce $TBA-ZnF_4$-capped quantum dots. In the third step, the $TBA-ZnF_4$-capped quantum dots were washed with toluene. In a fourth step, $TBA-ZnF_4$-capped quantum dots were admixed with didecyldimethylammonium chloride (DDA-Cl) to produce $DDA-ZnF_4$-capped quantum dots. In a fifth step, the $DDA-ZnF_4$-capped quantum dots were precipitated with acetonitrile. In a sixth step, the $DDA-ZnF_4$-capped quantum dots were redispersed in toluene in preparation for use in a device.

Example 3

Nanostructure Ink Compositions

Nanostructure ink compositions were formulated using fully dispersed red InP/ZnSe/ZnS quantum dots with $DDA-ZnF_4$ ligands, JEFFAMINE M-1000 (as a poly(alkylene oxide) additive), and at least one solvent as shown in TABLE 3.

TABLE 3

Nanostructure Ink Compositions

| Ink Sample | Solvents | Quantum Dot loading (wt %) | M1000 loading (wt %) | Density (g/mL) | Viscosity (mPa * s) | Jetting Test |
|---|---|---|---|---|---|---|
| 1 | 1-methoxynaphthalene:n-octylbenzene (9:1) | 1.7 | 0.2 | 1.08 | 6.1 | Good |
| 2 | 1-methoxynaphthalene:n-octylbenzene (9:1) | 3.3 | 0.2 | 1.09 | 6.8 | Not tested |
| 3 | 3-phenoxytoluene:n-octylbenzene (9:1) | 1.8 | 0.1 | 1.03 | 4.3 | Poor (wets nozzle) |
| 4 | cyclohexylbenzene:4-methylanisole (1:1) | 2.0 | 0.05 | 0.91 | 1.6 | Poor (nozzle plate cleaning hard) |
| 5 | 1-methoxynaphthalene:n-decylbenzene (9:1) | 1.7 | 0.2 | 1.09 | 5.3 | |
| 6 | 1-methoxynaphthalene:cyclohexylbenzene (9:1) | 1.7 | 0.2 | 1.08 | 4.9 | |

As can be seen in TABLE 3, varying amounts of the poly(alkylene oxide) additive JEFFAMINE M-1000 can be used. In order to achieve the best ink compositions, a minimum loading of poly(alkylene oxide) additive is required. The minimum amount depends on the choice of solvent and the quantum dot loading. For example, for a loading of 1.7 weight % of quantum dots in a solvent mixture of 3-phenoxytoluene:octylbenzene (9:1), it was found that a JEFFAMINE M-1000 loading of 0.05 weight % was not sufficient to obtain a clear dispersion; however, using a loading of 0.1 weight % of JEFFAMINE M-1000, full dispersion was observed (see Ink Sample 3). And, in the solvent mixture cyclohexylbenzene:4-methylanisole (1:1), a lower JEFFAMINE M-1000 loading of 0.05 weight % was sufficient to obtain full dispersion because the solvent mixture has a higher proportion of the more non-polar solvent cyclohexylbenzene (see Ink Sample 4). In general, a minimum poly(alkylene oxide) additive loading of 2 weight % relative to the quantum dot loading is required for full dispersion.

Since the additive will remain in the quantum dot film that is deposited, it is also desirable not to use an excess that could potentially change the device properties. Hence, the poly(alkylene oxide) additive loading should not exceed 40 weight % of the quantum dot loading. No detriment in device external quantum efficiency or photoluminescence quantum yield was observed using a poly(alkylene oxide) additive loading of 11 weight % relative to the quantum dot loading (see Ink Sample 1) compared to a control device with quantum dots spin-coated using octane with no poly(alkylene oxide) additive.

Example 4

Nanostructure Ink Composition 1

A stock solution of red InP/ZnSe/ZnS quantum dots with DDA-ZnF$_4$ ligands in 2.3 mL of n-octane (density of quantum dots in stock solution=78 mg/mL (180 mg of quantum dots)) was dried under vacuum in a Schlenk flask. The dried quantum dots were redispersed in n-octylbenzene (1 mL) containing JEFFAMINE M-1000 (0.02 mL). The mixture was stirred at 70° C. until a clear solution was obtained. The quantum dot solution was then diluted with 1-methoxynaphthalene (9 mL) in which the quantum dots remained well dispersed. The resulting ink was filtered through a PTFE 0.22 μm filter and degassed under vacuum prior to transfer into an ink cartridge.

Example 5

Comparative Example for Nanostructure Ink Composition 1 (Example 4)

The nanostructure ink composition of Example 4 was prepared without a poly(alkylene oxide) additive.

A stock solution of red InP/ZnSe/ZnS quantum dots with DDA-ZnF$_4$ ligands in 2.3 mL of n-octane (density of quantum dots in stock solution=78 mg/mL (180 mg of quantum dots)) was dried under vacuum in a Schlenk flask. The dried quantum dots were redispersed in n-octylbenzene (1 mL). The mixture was stirred at 70° C. until a clear solution was obtained. The quantum dot solution was then diluted with 1-methoxynaphthalene (9 mL) upon which the quantum dots agglomerated and the mixture turned turbid. An ink formulation could not be obtained.

Example 6

Nanostructure Ink Composition 2

A stock solution of red InP/ZnSe/ZnS quantum dots with DDA-ZnF$_4$ ligands in 13.9 mL of n-octane (density of quantum dots in stock solution=78 mg/mL (1080 mg of quantum dots)) was dried under vacuum in a Schlenk flask. The dried quantum dots were redispersed in n-octylbenzene (3 mL) containing JEFFAMINE M-1000 (0.06 mL). The mixture was stirred at 70° C. until a clear solution was obtained. The quantum dot solution was then diluted with 1-methoxynaphthalene (27 mL) in which the quantum dots remained well dispersed. The resulting ink was filtered through a PTFE 0.22 μm filter and degassed under vacuum prior to transfer into an ink cartridge.

Example 7

Nanostructure Ink Composition 3

A stock solution of red InP/ZnSe/ZnS quantum dots with DDA-ZnF$_4$ ligands in 2.3 mL of n-octane (density of quantum dots in stock solution=78 mg/mL (180 mg of quantum dots)) was dried under vacuum in a Schlenk flask. The dried quantum dots were redispersed in n-octylbenzene (1 mL) containing JEFFAMINE M-1000 (0.01 mL). The mixture was stirred at 70° C. until a clear solution was obtained. The quantum dot solution was then diluted with 1-3-phenoxytoluene (9 mL) in which the quantum dots remained well dispersed. The resulting ink was filtered through a PTFE 0.22 μm filter and degassed under vacuum prior to transfer into an ink cartridge.

Example 8

Comparative Example for Nanostructure Ink Composition 3 (Example 7)

The nanostructure ink composition of Example 7 was prepared without a poly(alkylene oxide) additive.

A stock solution of red InP/ZnSe/ZnS quantum dots with DDA-ZnF$_4$ ligands in 2.3 mL of n-octane (density of quantum dots in stock solution=78 mg/mL (180 mg of quantum dots)) was dried under vacuum in a Schlenk flask. The dried quantum dots were redispersed in n-octylbenzene (1 mL) containing JEFFAMINE M-1000 (0.005 mL). The mixture was stirred at 70° C. until a clear solution was obtained. The quantum dot solution was then diluted with 3-phenoxytoluene (9 mL) in which the quantum dots agglomerated and the mixture turned turbid. An ink formulation could not be obtained.

Example 9

Nanostructure Ink Composition 4

A stock solution of red InP/ZnSe/ZnS quantum dots with DDA-ZnF$_4$ ligands in 2.3 mL of n-octane (density of quantum dots in stock solution=78 mg/mL (180 mg of quantum dots)) was dried under vacuum in a Schlenk flask. The dried quantum dots were redispersed in cyclohexylbenzene (5 mL) containing JEFFAMINE M-1000 (0.005 mL). The mixture was stirred at 70° C. until a clear solution was obtained. The quantum dot solution was then diluted with 4-methylanisole (5 mL) in which the quantum dots remained well dispersed. The resulting ink was filtered through a PTFE 0.22 μm filter and degassed under vacuum prior to transfer into an ink cartridge.

Example 10

Nanostructure Ink Composition 5

A stock solution of red InP/ZnSe/ZnS quantum dots with DDA-ZnF$_4$ ligands in 13.9 mL of n-octane (density of quantum dots in stock solution=78 mg/mL (1080 mg of quantum dots)) was dried under vacuum in a Schlenk flask. The dried quantum dots were redispersed in n-decylbenzene (0.2 mL) containing JEFFAMINE M-1000 (0.004 mL). The mixture was stirred at 70° C. until a clear solution was obtained. The quantum dot solution was then diluted with 1-methoxynaphthalene (1.8 mL) in which the quantum dots remained well dispersed. The resulting ink was filtered through a PTFE 0.22 μm filter and degassed under vacuum prior to transfer into an ink cartridge.

Example 11

Nanostructure Ink Composition 6

A stock solution of red InP/ZnSe/ZnS quantum dots with DDA-ZnF$_4$ ligands in 0.46 mL of n-octane (density of quantum dots in stock solution=78 mg/mL (36 mg of quantum dots)) was dried under vacuum in a Schlenk flask. The dried quantum dots were redispersed in cyclohexylbenzene (0.2 mL) containing JEFFAMINE M-1000 (0.004 mL). The mixture was stirred at 70° C. until a clear solution was obtained. The quantum dot solution was then diluted with 1-methoxynaphthalene (1.8 mL) in which the quantum dots remained well dispersed. The resulting ink was filtered through a PTFE 0.22 μm filter and degassed under vacuum prior to transfer into an ink cartridge.

Example 12

Nanostructure Ink Composition with Blue Quantum Dots

A stock solution of blue ZnSe/ZnS quantum dots with DDA-ZnF$_4$ ligands in 1 mL of toluene (density of quantum dots in stock solution=18 mg/mL (18 mg of quantum dots)) was dried under vacuum in a Schlenk flask. The dried quantum dots were redispersed in 4-methylanisole (1 mL) containing JEFFAMINE M-1000 (0.005 mL). The mixture was stirred at 70° C. until a clear solution was obtained. The resulting ink was filtered through a PTFE 0.22 μm filter and degassed under vacuum prior to transfer into an ink cartridge.

While various embodiments have been described above, it should be understood that they have been presented by way of example only, and not limitation. It will be apparent to persons skilled in the relevant art that various changes in form and detail can be made therein without departing from the spirit and scope of the invention. Thus, the breadth and scope should not be limited by any of the above-described exemplary embodiments, but should be defined only in accordance with the following claims and their equivalents.

All publications, patents and patent applications mentioned in this specification are indicative of the level of skill of those skilled in the art to which this invention pertains, and are herein incorporated by reference to the same extent as if each individual publication, patent or patent application was specifically and individually indicated to be incorporated by reference.

What is claimed is:

1. A nanostructure composition comprising:
   (a) an organic solvent;
   (b) a nanostructure comprising a core and a shell;
   (c) inorganic ligands bound to the surface of the nanostructure; and
   (d) a poly(alkylene oxide) additive of Formula (IV):

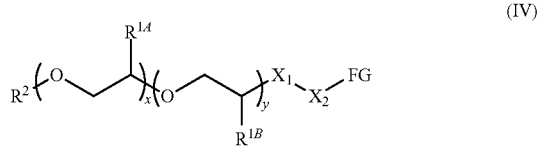

(IV)

wherein:
   x is 1 to 100;
   y is 0 to 100;
   $R^{1A}$ and $R^{1B}$ independently are H or $C_{1-20}$ alkyl;
   $R^2$ is $C_{1-20}$ alkyl;
   $X_1$ is a bond or $C_{1-12}$ alkyl;
   $X_2$ is a bond, —O—, -OC(=O)—, or amido;
   FG is —OH, —NH$_2$, —NH$_3$+, —N$_3$, —C(=O)OR$^3$, —P(=O)(OR$^4$)$_2$, or —P(R$^5$)$_4$;
   $R^3$ is H, $C_{1-20}$ alkyl, or $C_{6-14}$ aryl;
   $R^4$ is independently H, $C_{1-20}$ alkyl, or $C_{6-14}$ aryl; and
   $R^5$ is independently H, $C_{1-20}$ alkyl, or $C_{6-14}$ aryl.

2. The nanostructure composition of claim 1, wherein x is 2-20 and y is 1-10.

3. The nanostructure composition of claim 1, wherein at least one of:
   $R^{1A}$ is H and $R^{1B}$ is CH$_3$; or
   $X^1$ is a bond and $X^2$ is a bond.

4. The nanostructure composition of claim 1, wherein FG is —OH, —NH$_2$, —N$_3$, or —CO$_2$H.

5. The nanostructure composition of claim 1, wherein the poly(alkylene oxide) has Formula VI:

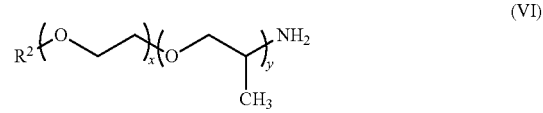

(VI)

wherein:
   x is 1 to 100;
   y is 0 to 100; and
   $R^2$ is $C_{1-20}$ alkyl.

6. The nanostructure composition of claim 5, wherein x is 19, y is 3, and $R^2$ is —CH$_3$.

7. The nanostructure composition of claim 1, wherein the inorganic ligands comprise a halometallate anion.

8. The nanostructure composition of claim 7, wherein the halometallate anion is fluorozincate, tetrafluoroborate, or hexafluorophosphate.

9. The nanostructure composition of claim 7, wherein the halometallate anion has the structure of one of Formulas (I)-(III):
   $MX_3^-$(I); $MX_{4-x}Y_x^-$(II); or $MX_{4-x}Y_x^{2-}$(III);
   wherein:
      M is selected from the group consisting of Zn, Cd, Hg, Cu, Ag, and Au;
      X is selected from the group consisting of Br, Cl, F, and I;
      Y is selected from the group consisting of Br, Cl, F, and I; and
      x is 0, 1, or 2.

10. The nanostructure composition of claim 9, wherein the halometallate anion is $CdCl_3^-$, $CdCl_4^{2-}$, $CdI_3^-$, $CdBr_3^-$, $CdBr_4^{2-}$, $InCl_4^-$, $HgCl_3^-$, $ZnCl_3^-$, $ZnCl_4^{2-}$, or $ZnBr_4^{2-}$.

11. The nanostructure composition of claim 1, wherein the inorganic ligands comprise an organic cation selected from the group consisting of a tetraalkylammonium cation, an alkylphosphonium cation, a formamidinium cation, a guanidinium cation, an imidazolium cation, and a pyridinium cation.

12. The nanostructure composition of claim 11, wherein the inorganic ligands comprise oleyltrimethylammonium, phenylethyltrimethylammonium, benzyltrimethylammonium, phenyltrimethylammonium, benzylhexadecyldimethylammonium, benzyltetradecyldimethylammonium, benzyldodecyldimethylammonium, benzyldecyldimethylammonium, benzyloctyldimethylammonium, benzyltributylammonium, benzyltriethylammonium, a tetraalkylammonium cation selected from the group consisting of dioctadecyldimethylammonium, dihexadecyldimethylammonium, ditetradecyldimethylammonium, didodecyldimethylammonium, didecyldimethylammonium, dioctyldimethylammonium, bis(ethylhexyl)dimethylammonium, octadecyltrimethylammonium, hexadecyltrimethylammonium, tetradecyltrimethylammonium, dodecyltrimethylammonium, decyltrimethylammonium, ethyltrimethylammonium, octyltrimethylammonium, tetrabutylammonium, tetrapropylammonium, diisopropyldimethylammonium, tetraethylammonium, and tetramethylammonium, or an alkylphosphonium cation selected from the group consisting of tetraphenylphosphonium, dimethyldiphenylphosphonium, methyltriphenoxyphosphonium, hexadecyltributylphosphonium, octyltributylphosphonium, tetradecyltrihexylphosphonium, tetrakis(hydroxymethyl)phosphonium, tetraoctylphosphonium, tetrabutylphosphonium, and tetramethylphosphonium.

13. The nanostructure composition of claim 1, wherein the inorganic ligands comprise a $ZnF_4^-$ anion and a didecyldimethylammonium cation.

14. The nanostructure composition of claim 1, wherein at least one of:
the core comprises one of Si, Ge, Sn, Se, Te, B, C, P, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HeS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $Al_2OC$, or a combination thereof; or
the shell comprises CdS, CdSe, CdO, CdTe, ZnS, ZnO, ZnSe, ZnTe, MgTe, GaAs, GaSb, GaN, HgO, HgS, HgSe, HgTe, InAs, InSb, InN, AlAs, AlN, AlSb, AlS, PbS, PbO, PbSe, PbTe, MgO, MgS, MgSe, MgTe, CuCl, Ge, Si, or alloys thereof.

15. The nanostructure composition of claim 1, wherein the core comprises InP and the shell is a first shell comprising ZnSe, and the nanostructure comprises a second shell comprising ZnS.

16. The nanostructure composition of claim 1, wherein the organic solvent is selected from the group consisting of 1-tetralone, 3-phenoxytoluene, acetophenone, 1-methoxynaphthalene, n-octylbenzene, n-nonylbenzene, 4-methylanisole, n-decylbenzene, p-diisopropylbenzene, pentylbenzene, tetralin, cyclohexylbenzene, chloronaphthalene, 1,4-dimethylnaphthalene, 3-isopropylbiphenyl, p-methylcumene, dipentylbenzene, o-diethylbenzene, m-diethylbenzene, p-diethylbenzene, 1,2,3,4-tetramethylbenzene, 1,2,3,5-tetramethylbenzene, 1,2,4,5-tetramethylbenzene, butylbenzene, dodecylbenzene, 1-methylnaphthalene, 1,2,4-trichlorobenzene, diphenyl ether, diphenylmethane, 4-isopropylbiphenyl, benzyl benzoate, 1,2-bi (3,4-dimethylphenyl) ethane, 2-isopropylnaphthalene, dibenzyl ether, and a combination thereof.

17. A light emitting diode comprising:
(a) a first conductive layer;
(b) a second conductive layer; and
(c) an emitting layer between the first conductive layer and the second conductive layer, the emitting layer comprising a nanostructure composition comprising (i) an organic solvent; (ii) a nanostructure comprising a core and a shell, (iii) inorganic ligands bound to the surface of the nanostructure; and (iii) a poly(alkylene oxide) additive of Formula (IV):

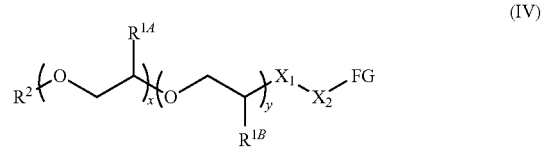

wherein:
x is 1 to 100;
y is 0 to 100;
$R^{1A}$ and $R^{1B}$ independently are H or $C_{1-20}$ alkyl;
$R^2$ is $C_{1-20}$ alkyl;
$X_1$ is a bond or $C_{1-12}$ alkyl;
$X_2$ is a bond, —O—, —OC(=O)—, or amido;
FG is —OH, —$NH_2$, —$NH_3^+$, —$N_3$, —C(=O)$OR^3$, —P(=O) $(OR^4)_2$, or —P($R^5$)$_4$;
$R^3$ is H, $C_{1-20}$ alkyl, or $C_{6-14}$ aryl;
$R^4$ is independently H, $C_{1-20}$ alkyl, or $C_{6-14}$ aryl; and
$R^5$ is independently H, $C_{1-20}$ alkyl, or $C_{6-14}$ aryl.

18. The light emitting diode of claim 17, wherein the inorganic ligands comprise a halometallate anion.

19. The light emitting diode of claim 18, wherein the inorganic ligands comprise an organic cation selected from the group consisting of a tetraalkylammonium cation, an alkylphosphonium cation, a formamidinium cation, a guanidinium cation, an imidazolium cation, and a pyridinium cation.

* * * * *